(12) United States Patent
Cholewa et al.

(10) Patent No.: US 11,217,907 B2
(45) Date of Patent: Jan. 4, 2022

(54) DISK HAVING AN ELECTRIC CONNECTING ELEMENT

(71) Applicant: SAINT-GOBAIN GLASS FRANCE, Courbevoie (FR)

(72) Inventors: Harald Cholewa, Aachen (DE); Christoph Degen, Toenisvorst (DE); Bernhard Reul, Herzogenrath (DE); Mitja Rateiczak, Wuerselen (DE); Andreas Schlarb, Wuppertal (DE); Lothar Lesmeister, Landgraaf (NL)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 31 days.

(21) Appl. No.: 16/793,430

(22) Filed: Feb. 18, 2020

(65) Prior Publication Data

US 2020/0185839 A1 Jun. 11, 2020

Related U.S. Application Data

(62) Division of application No. 14/115,091, filed as application No. PCT/EP2012/056964 on Apr. 17, 2012, now abandoned.

(30) Foreign Application Priority Data

May 10, 2011 (EP) ...................................... 1165501
May 10, 2011 (EP) ...................................... 1165506

(51) Int. Cl.
*H01R 4/02* (2006.01)
*H05B 3/84* (2006.01)
(Continued)

(52) U.S. Cl.
CPC ................. *H01R 4/02* (2013.01); *H05B 3/84* (2013.01); *H05K 3/4015* (2013.01);
(Continued)

(58) Field of Classification Search
CPC .......... H01R 4/02; H01R 4/027; H01R 4/028; H05B 3/84; H05B 3/845; H05B 3/86
See application file for complete search history.

(56) References Cited

U.S. PATENT DOCUMENTS 2,062,335 A 12/1936 Howard
2,481,385 A 9/1949 Bloom
(Continued)

FOREIGN PATENT DOCUMENTS

CN 200944682 Y 9/2007
CN 101244686 A 8/2008
(Continued)

OTHER PUBLICATIONS

Notice of Opposition for European Application No. 12714016.8 filed Dec. 20, 2017 on behalf of Saint-Gobain Glass France. dated Sep. 28, 2018. 18 pages.
(Continued)

*Primary Examiner* — Paresh H Paghadal
(74) *Attorney, Agent, or Firm* — Pillsbury Winthrop Shaw Pittman LLP

(57) ABSTRACT

A disk having at least one electric connecting element is described. The disk has a substrate, and electrically conductive structure on a region of the substrate, a connecting element containing at least chromium-containing steel, and a layer of a soldering compound that electrically connects the connecting element to sub-regions of the electrically conductive structure.

16 Claims, 12 Drawing Sheets

Figure 1:
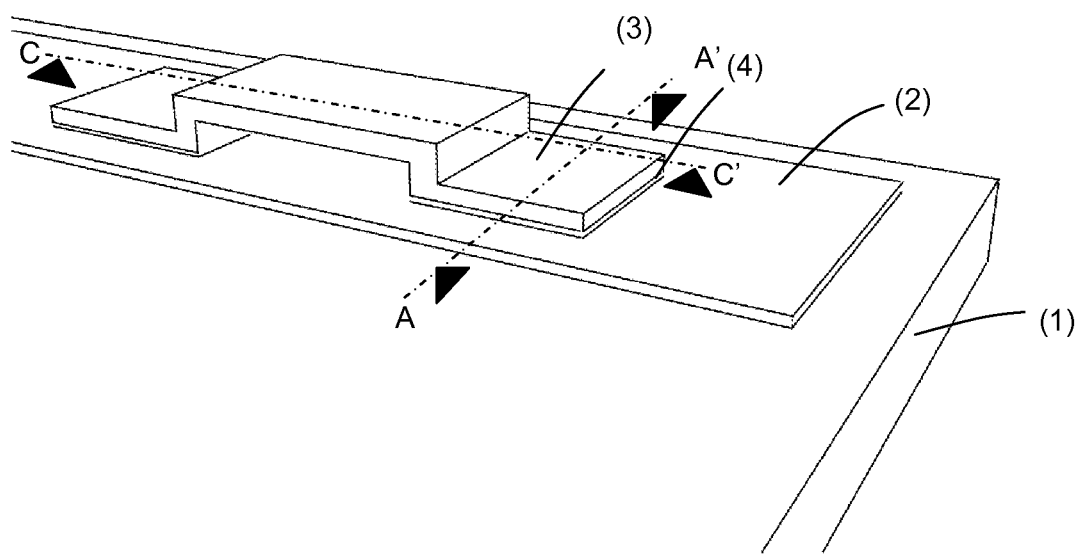

(51) Int. Cl.
  *H05K 3/40* (2006.01)
  *H05K 3/34* (2006.01)
(52) U.S. Cl.
  CPC ... *H05K 3/3494* (2013.01); *H05K 2201/1028* (2013.01); *H05K 2201/1031* (2013.01)

(56) References Cited

U.S. PATENT DOCUMENTS

| | | | |
|---|---|---|---|
| 2,644,066 | A | 6/1953 | Glynn |
| 2,672,414 | A | 3/1954 | Smith |
| 2,709,211 | A | 5/1955 | Glynn |
| 2,736,649 | A | 2/1956 | Phillips |
| 2,745,738 | A * | 5/1956 | Phillips ............... C22C 38/28 420/62 |
| 3,088,833 | A | 5/1963 | Pirooz |
| 3,204,326 | A | 9/1965 | Granitsas |
| 3,484,584 | A | 12/1969 | Shaw |
| 3,519,496 | A | 7/1970 | Finn |
| 3,534,148 | A | 10/1970 | Bange |
| 3,746,536 | A | 7/1973 | Kuse |
| 3,864,112 | A | 2/1975 | Mattox |
| 3,880,369 | A | 4/1975 | Kunstovney et al. |
| 4,023,008 | A | 5/1977 | Durussel |
| 4,179,285 | A | 12/1979 | Tanczyn |
| 4,246,467 | A * | 1/1981 | Boaz ............... H05B 3/84 174/94 R |
| 4,321,296 | A | 3/1982 | Rougier |
| 4,403,307 | A | 9/1983 | Maeda |
| 4,498,096 | A | 2/1985 | Addie |
| 4,908,548 | A | 3/1990 | Mizohata |
| 5,596,335 | A | 1/1997 | Dishart |
| 5,738,554 | A | 4/1998 | Borger |
| 5,748,155 | A | 5/1998 | Kadunce et al. |
| 5,902,536 | A | 5/1999 | Shumaker, Jr. et al. |
| 5,961,737 | A | 10/1999 | Glenn |
| 6,284,985 | B1 | 9/2001 | Naba |
| 6,396,026 | B2 | 5/2002 | Gillner |
| 6,406,337 | B1 | 6/2002 | Machado |
| 6,638,120 | B2 | 10/2003 | Costa |
| 6,685,514 | B2 | 2/2004 | Costa |
| 6,787,700 | B2 | 9/2004 | Nagao |
| 6,790,104 | B2 | 9/2004 | Antaya |
| 6,816,385 | B1 | 11/2004 | Alcoe |
| 7,134,201 | B2 | 11/2006 | Ackerman |
| 7,514,654 | B2 | 4/2009 | Okajima |
| 7,658,617 | B1 | 2/2010 | Brodsky et al. |
| 7,675,004 | B2 | 3/2010 | Nakajima et al. |
| 7,909,665 | B2 | 3/2011 | Lyon |
| 7,974,104 | B2 | 7/2011 | Kitada |
| 8,816,214 | B2 | 8/2014 | Ziegler |
| 8,816,215 | B2 | 8/2014 | Reul |
| 8,905,778 | B2 | 12/2014 | Jen Rich et al. |
| 9,385,437 | B2 | 7/2016 | Cholewa et al. |
| D815,042 | S | 4/2018 | Jenrich |
| 2002/0001997 | A1 | 1/2002 | Reul |
| 2002/0102886 | A1 | 8/2002 | Costa |
| 2002/0111081 | A1 | 8/2002 | Machado |
| 2003/0030064 | A1 | 2/2003 | Takano et al. |
| 2003/0073349 | A1 | 4/2003 | Nagao |
| 2003/0180545 | A1* | 9/2003 | Capriotti ............... H05B 3/84 428/432 |
| 2005/0029666 | A1 | 2/2005 | Kurihara |
| 2005/0112291 | A1 | 5/2005 | Okajima |
| 2006/0102610 | A1 | 5/2006 | Hoepfner et al. |
| 2006/0228953 | A1 | 10/2006 | Pereira |
| 2006/0240265 | A1 | 10/2006 | Cook et al. |
| 2007/0030064 | A1 | 2/2007 | Yu |
| 2007/0031279 | A1 | 2/2007 | Soga |
| 2007/0105412 | A1 | 5/2007 | Hoepfner |
| 2007/0224842 | A1* | 9/2007 | Hoepfner ............. B23K 35/264 439/34 |
| 2008/0164248 | A1 | 7/2008 | Reul |
| 2008/0230269 | A1 | 9/2008 | Susai et al. |
| 2008/0280503 | A1 | 11/2008 | Van Der Meulen |
| 2009/0044464 | A1 | 2/2009 | Schmidt et al. |
| 2009/0277671 | A1 | 11/2009 | Hahn |
| 2010/0020380 | A1 | 1/2010 | Tonar et al. |
| 2010/0285685 | A1 | 11/2010 | Ziegler |
| 2010/0295187 | A1 | 11/2010 | Tsuruok |
| 2010/0321798 | A1 | 12/2010 | Chen et al. |
| 2011/0056589 | A1 | 3/2011 | De Boer et al. |
| 2011/0056747 | A1 | 3/2011 | Matsushita et al. |
| 2012/0060559 | A1 | 3/2012 | Boussaad |
| 2012/0298416 | A1 | 11/2012 | Ziegler |
| 2012/0305311 | A1 | 12/2012 | Jenrich |
| 2012/0318566 | A1 | 12/2012 | Reul et al. |
| 2013/0043066 | A1 | 2/2013 | Cholewa et al. |
| 2013/0045647 | A1 | 2/2013 | Jenrich et al. |
| 2014/0110166 | A1 | 4/2014 | Degen et al. |
| 2014/0158424 | A1 | 6/2014 | Schlarb et al. |
| 2014/0170913 | A1 | 6/2014 | Degen et al. |
| 2014/0182932 | A1 | 7/2014 | Cholewa et al. |
| 2014/0301892 | A1 | 10/2014 | Maekawa et al. |
| 2015/0179539 | A1 | 6/2015 | Tamai |
| 2015/0236431 | A1 | 8/2015 | Schmalbuch et al. |
| 2016/0309588 | A1 | 10/2016 | Cholewa |

FOREIGN PATENT DOCUMENTS

| | | |
|---|---|---|
| DE | 1936780 A1 | 2/1970 |
| DE | 10045489 C1 | 12/2001 |
| DE | 20203202 U1 | 6/2002 |
| DE | 102006017675 | 10/2007 |
| DE | 202008015441 | 4/2010 |
| DE | 102009016353 | 10/2010 |
| DE | 202011100906 U1 | 6/2011 |
| DE | 102010018860 A1 | 11/2011 |
| EA | 201290855 A1 | 2/2013 |
| EP | 0023121 | 1/1981 |
| EP | 488878 A1 | 6/1992 |
| EP | 0720253 | 7/1996 |
| EP | 0848449 A1 | 6/1998 |
| EP | 1488972 | 12/2004 |
| EP | 1942703 | 7/2008 |
| EP | 2299544 A1 | 3/2011 |
| EP | 2365730 A1 | 9/2011 |
| EP | 2367399 A1 | 9/2011 |
| EP | 2408260 A | 1/2012 |
| FR | 1104595 A | 11/1955 |
| GB | 751536 A | 6/1956 |
| GB | 1163224 | 9/1969 |
| JP | S5678170 A | 6/1981 |
| JP | S60208076 A | 10/1985 |
| JP | S60212987 A | 10/1985 |
| JP | H0696847 A | 4/1994 |
| JP | H0658557 U | 8/1994 |
| JP | HD8246105 A | 9/1996 |
| JP | H09139565 A | 5/1997 |
| JP | H09226522 A | 9/1997 |
| JP | H10163355 A | 6/1998 |
| JP | 2908922 B2 | 6/1999 |
| JP | H11306862 A | 11/1999 |
| JP | H11347785 A | 12/1999 |
| JP | 2001-102151 A | 4/2001 |
| JP | 2001126648 A | 5/2001 |
| JP | 2003521093 A | 7/2003 |
| JP | 3957302 B2 | 8/2007 |
| JP | 2007335260 A | 12/2007 |
| JP | 2008-041518 A | 2/2008 |
| JP | 2008218399 A | 9/2008 |
| JP | 2010-500703 A | 1/2010 |
| JP | 2010108854 A | 5/2010 |
| JP | 2010527120 A | 8/2010 |
| JP | 2014-508696 A | 4/2014 |
| KR | 10-0236812 B1 | 1/2000 |
| KR | 20080063712 A | 7/2008 |
| MX | 2013015237 A1 | 2/2014 |
| WO | WO 98/47200 A1 | 10/1998 |
| WO | WO 01/99472 A1 | 12/2001 |
| WO | WO 2003/076239 A1 | 9/2003 |
| WO | WO 2004012302 A1 | 2/2004 |
| WO | WO 2004/068643 | 8/2004 |
| WO | WO 2006098160 A1 | 9/2006 |

(56) References Cited

FOREIGN PATENT DOCUMENTS

| WO | WO 2006132319 A1 | 12/2006 |
|----|------------------|---------|
| WO | WO 2007/110610 | 10/2007 |
| WO | WO 2009/135469 A1 | 11/2009 |
| WO | WO 2012/007303 A1 | 1/2012 |
| WO | WO 2012/152543 A1 | 11/2012 |
| WO | WO 2013004434 A1 | 1/2013 |

OTHER PUBLICATIONS

Non-Final Office Action for U.S. Appl. No. 13/580,741, filed Aug. 23, 2012 on behalf of Saint-Gobain Glass France. dated Mar. 14, 2014. 13 pages.
Non-Final Office Action for U.S. Appl. No. 13/695,426, filed Oct. 30, 2012 on behalf of Saint-Gobain Glass France. dated Jan. 28, 2015. 38 pages.
Non-Final Office Action for U.S. Appl. No. 13/575,566, filed Jul. 26, 2012 on behalf of Saint-Gobain Glass France. dated Mar. 7, 2014. 14 pages.
Advisory Action for U.S. Appl. No. 13/695,426, filed Oct. 30, 2012 on behalf of Saint-Gobain Glass France. dated Sep. 30, 2015. 4 pages.
Corrected Notice of Allowability for U.S. Appl. No. 14/115,839, filed Feb. 21, 2014, on be~1alf of Saint-Gobain Glass France. dated Oct. 4, 2018. 9 pages.
Final Office Action for U.S. Appl. No. 13/695,426, filed Oct. 30, 2012 on behalf of Saint-Gobain Glass France. dated Jul. 15, 2015. 19 pages.
Final Office Action for U.S. Appl. No. 14/115,844, filed Dec. 18, 2013 on behalf of Saint-Gobain Glass France. dated Aug. 1, 2018. 19 pages.
Final Office Action for U.S. Appl. No. 15/197,298, filed Jun. 29, 2016 on behalf of Saint-Gobain Glass France. dated Feb. 21, 2019. 31 pages.
International Search Report for International Application No. PCT/EP2011/052195 filed Feb. 15, 2011 on behalf of Saint-Gobain Glass France. dated May 12, 2011. 6 pages.(English Translation+ German Original).
International Search Report for International Application No. PCT/EP2011/052196 filed Feb. 15, 2011 on behalf of Saint-Gobain Glass France. dated May 17, 2011. 7 pages. (English Translation+ German Original).
International Search Report for International Application No. PCT/EP2011/061195 filed Jul. 4, 2011 on behalf of Saint-Gobain Glass France. dated Sep. 26, 2011. 6 pages. (English Translation + German Original).
Non-Final Office Action for U.S. Appl. No. 13/695,426, filed Oct. 30, 2012 on behalf of Saint-Gobain Glass France. dated Nov. 24, 2015. 10 pages.
Non-Final Office Action for U.S. Appl. No. 15/197,298, filed Jun. 29m 2016 on behalf of Saint-Gobain Glass France. dated Jul. 31, 2018. 27 pages.
Notice of Allowance for U.S. Appl. No. 13/575,566, filed Jul. 26, 2012 on behalf of Saint-Gobain Glass France. dated Jul. 7, 2014. 9 pages.
Notice of Allowance for U.S. Appl. No. 13/580,741, filed Aug. 23, 2012 on behalf of Saint-Gobain Glass France. dated Jul. 8, 2014. 10 pages.
Notice of Allowance for U.S. Appl. No. 13/695,426, filed Oct. 30, 2012 on behalf of Saint-Gobain Glass France. dated Apr. 26, 2016.11 pages.
Notice of Allowance for U.S. Appl. No. 14/115,839, filed Feb. 21, 2014, on behalf of Saint-Gobain Glass France. dated Sep. 12, 2018. 13 pages.
Notice of Allowance for U.S. Appl. No. 14/115,844, filed Dec. 18, 2013, on behalf of Saint-Gobain Glass France. dated Jan. 9, 2019. 11 pages.
Restriction Requirement for U.S. Appl. No. 13/695,426, filed Oct. 30, 2012 on behalf of Saint-Gobain Glass France. dated Oct. 20, 2014. 9 pages.
Restriction Requirement for U.S. Appl. No. 15/197,298, filed Jun. 29, 2016 on behalf of Saint-Gobain Glass France. dated Mar. 22, 2018. 7 pages.
Written Opinion for International Application No. PCT/EP2011/052195 filed Feb. 15, 2011 on behalf of Saint-Gobain Glass France. dated May 12, 2011. 19 pages. (English Translation + German Original).
Written Opinion for International Application No. PCT/EP2011/052196 filed Feb. 15, 2011 on behalf of Saint-Gobain Glass France. dated May 17, 2011. 21 pages. (English Translation + German Original).
Written Opinion for International Application No. PCT/EP2011/061195 filed Jul. 4, 2011 on behalf of Saint-Gobain Glass France. dated Sep. 26, 2011. 19 pages. (English Translation + German Original).
Advisory Action issued for U.S. Appl. No. 14/115,844, filed Dec. 18, 2013 on behalf of Saint-Gobain Glass France. dated Nov. 28, 2017. 4 pages.
Non-Final Office Action issued for U.S. Appl. No. 14/115,844, filed Dec. 18, 2013 on behalf of Saint-Gobain Glass France. dated Dec. 27, 2017. 18 pages.
Final Office Action issued for U.S. Appl. No. 14/115,839, filed Feb. 21, 2014 on behalf of Saint-Gobain Glass France. dated Feb. 20, 2018. 17 pages.
Non-Final Office Action for U.S. Appl. No. 14/115,839, filed Feb. 21, 2014 on behalf of Christoph Degen. dated Sep. 20, 2017. 22 pages.
PCT Written Opinion dated Jun. 1, 2012 for PCT/EP2012/056963 filed on Apr. 17, 2012 in the name of Saint-Gobain Glass France (English translation and German original).
Written Opinion dated Jun. 14, 2012 for PCT/EP2012/056964 filed on Apr. 17, 2012 in the name of Saint-Gobain Glass France German to English.
PCT International Preliminary Report on Patentability dated Nov. 12, 2013 for PCT/EP2012/056965 filed on Apr. 17, 2012 in the name of Saint-Gobain Glass France (English Translation+ German Original).
PCT International Preliminary Report on Patentability dated Nov. 12, 2013 for PCT/EP2012/056964 filed on Apr. 17, 2012 in the name of Saint-Gobain Glass France (English Translation+ German Original).
PCT International Preliminary Report on Patentability dated Nov. 12, 2013 for PCT/EP2012/056963 filed on Apr. 17, 2012 in the name of Saint-Gobain Glass France (English Translation+ German Original).
PCT International Search Report dated Jun. 14, 2012 for PCT/EP2012/056964 filed on Apr. 17, 2012 in the name of Saint-Gobain Glass France (English translation and German original).
PCT International Search Report dated Jun. 8, 2012 for PCT/EP2012/056965 filed on Apr. 17, 2012 in the name of Saint-Gobain Glass France (English translation and German original).
PCT International Search Report dated Jun. 1, 2012 for PCT/EP2012/056963 filed on Apr. 17, 2012 in the name of Saint-Gobain Glass France (English translation and German original).
PCT Written Opinion for PCT/EP2012/056965 filed Apr. 17, 2012 on behalf of Saint-Gobain Glass France. dated Jun. 8, 2012. 12 pages German original + English translation.
Restriction Requirement for U.S. Appl. No. 14/115,844, filed Dec. 18, 2013 on behalf of Christoph Degen. dated Jun. 29, 2016. 6 pages.
Non-Final Office Action for U.S. Appl. No. 14/115,844, filed Dec. 18, 2013 on behalf of Christoph Degen. dated Jan. 19, 2017. 18 pages.
Final Office Action for U.S. Appl. No. 14/115,844, filed Dec. 18, 2013 on behalf of Christoph Degen. dated Jun. 27, 2017. 13 pages.
PCT Written Opinion for PCT/EP2013/064576 filed Jul. 10, 2013 on behalf of Saint-Gobain Glass France. dated Oct. 22, 2013. German original+ English translation. 16 pages.
PCT Written Opinion for PCT/EP2013/064575 filed Jul. 10, 2013 on behalf of Saint-Gobain Glass France. dated Oct. 17, 2013. German original+ English translation. 16 pages.

(56) References Cited

OTHER PUBLICATIONS

PCT International Search Report for PCT/EP2013/064576 filed Jul. 10, 2013 on behalf of Saint-Gobain Glass France. dated Oct. 22, 2013. German original + English translation. 2 pages.
PCT International Search Report for PCT/EP2013/064575 filed Jul. 10, 2013 on 11 behalf of Saint-Gobain Glass France. dated Oct. 17, 2013. German original + English translation. 3 pages.
Restriction Requirement for U.S. Appl. No. 14/115,839, filed Feb. 21, 2014 on behalf of Christoph Degen. dated Jan. 11, 2016. 9 pages.
Non-Final Office Action for U.S. Appl. No. 14/115,839, filed Feb. 21, 2014 on behalf of Christoph Degen. dated May 4, 2016. 17 pages.
Final Office Action for U.S. Appl. No. 14/115,839, filed Feb. 21, 2014 on behalf of Christoph Degen. dated Oct. 19, 2016. 15 pages.
Non-Final Office Action for U.S. Appl. No. 14/424,936, filed Feb. 27, 2015 on behalf of Klaus Schmalbuch. dated Sep. 8, 2016. 7 pages.
Non-Final Office Action for U.S. Appl. No. 14/424,939, filed Feb. 27, 2015 on behalf of Klaus Schmalbuch. dated Feb. 4, 2016. 17 pages.
Non-Final Office Action for U.S. Appl. No. 14/424,939, filed Feb. 27, 2015 on behalf of Klaus Schmalbuch. dated Jul. 6, 2016. 16 pages.
Manko, H. H., "Chapter 1: Solder-Bond Formation," *Solders and soldering*, McGraw-Hill, (2001), 6 pages.

\* cited by examiner

A - A'

E - E'

DISK HAVING AN ELECTRIC CONNECTING ELEMENT

CROSS-REFERENCE TO RELATED APPLICATIONS

This application is a divisional of U.S. application Ser. No. 14/115,091, filed on Feb. 10, 2014, which is the U.S. National Stage of PCT/EP2012/056964, filed Apr. 17, 2012, which in turn claims priority to European Patent Application numbers EP 11165501.5 and EP 11165506.4, both filed May 10, 2011. The content of these applications are incorporated herein by reference in their entireties.

The invention relates to a pane with an electrical connection element and an economical and environmentally friendly method for its manufacture.

The invention further relates to a pane with an electrical connection element for vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur that strain the panes and can cause breakage of the pane during manufacture and operation.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). The objective is to ban extremely problematic components from products resulting from the massive increase in disposable electronics. The substances affected are lead, mercury, and cadmium. This relates, among other things, to the implementation of lead-free soldering materials in electrical applications on glass and the introduction of corresponding replacement products.

EP 1 942 703 A2 discloses an electrical connection element on panes of vehicles, wherein the difference in the coefficient of thermal expansion of the pane and the electrical connection element is $<5\times10^{-6} 1/° C$. and the connection element contains predominantly titanium. In order to enable adequate mechanical stability and processability, it is proposed to use an excess of solder material. The excess of solder material flows out from the intermediate space between the connection element and the electrically conductive structure. The excess of solder material causes high mechanical stresses in the glass pane. These mechanical stresses ultimately result in breakage of the pane. In addition, titanium is poorly solderable. This results in poor adhesion of the connection element to the pane. The connection element must, moreover, be connected to the onboard electronics via an electrically conductive material, for example, copper, by welding, for instance. Titanium is poorly weldable.

The object of the present invention is to provide a pane with an electrical connection element and an economical and environmentally friendly method for its manufacture, whereby critical mechanical stresses in the pane are avoided.

The object of the present invention is, further, to provide an improved material for the connection element compared to the prior art, having better availability and better processability, such as solderability, weldability, and cold formability.

The object of the present invention is accomplished according to the invention by a device according to independent claim 1. Preferred embodiments emerge from the subclaims.

The pane according to the invention with at least one connection element comprises the following characteristics:
- a substrate,
- an electrically conductive structure on a region of the substrate,
- a connection element, wherein the connection element contains at least chromium, preferably at least a chromium-containing steel, and
- a layer of a solder material, which electrically connects the connection element to subregions of the electrically conductive structure.

The substrate contains, preferably, glass, particularly preferably, flat glass, float glass, quartz glass, borosilicate glass, soda lime glass. In an alternative preferred embodiment, the substrate contains polymers, particularly preferably, polyethylene, polypropylene, polycarbonate, polymethyl methacrylate, and/or mixtures thereof.

The substrate has a first coefficient of thermal expansion. The connection element has a second coefficient of thermal expansion. In an advantageous embodiment of the invention, the difference between the first and the second coefficient of thermal expansion is $<5\times10^{-6}/° C$. Because of this, better adhesion is obtained.

An electrically conductive structure is applied on the pane. An electrical connection element is electrically connected by a soldering material on subregions to the electrically conductive structure. The solder material flows out with an outflow width of <1 mm from the intermediate space between the connection element and the electrically conductive structure.

In a preferred embodiment, the maximum outflow width is preferably less than 0.5 mm and, in particular, roughly 0 mm. This is particularly advantageous with regard to the reduction mechanical stresses in the pane, the adhesion of the connection element, and the reduction in the amount of solder.

The maximum outflow width is defined as the distance between the outer edges of the connection element and the point of the solder material crossover, at which the solder material drops below a layer thickness of 50 μm. The maximum outflow width is measured on the solidified solder material after the soldering process.

A desired maximum outflow width is obtained through a suitable selection of solder material volume and vertical distance between the connection element and the electrically conductive structure, which can be determined by simple experiments. The vertical distance between the connection element and the electrically conductive structure can be predefined by an appropriate process tool, for example, a tool with an integrated spacer.

The maximum outflow width can even be negative, i.e., pulled back into the intermediate space formed by an electrical connection element and an electrically conductive structure.

In an advantageous embodiment of the pane according to the invention, the maximum outflow width is pulled back in a concave meniscus into the intermediate space formed by the electrical connection element and the electrically conductive structure. A concave meniscus is created, for example, by increasing the vertical distance between the spacer and the conductive structure during the soldering process, while the solder is still fluid.

The advantage resides in the reduction of mechanical stresses in the pane, in particular, in the critical region present with a large solder material crossover.

The first coefficient of thermal expansion is preferably from $8\times10^{-6}/°C$ to $9\times10^{-6}/°C$. The substrate is preferably glass that has, preferably, a coefficient of thermal expansion from $8.3\times10^{-6}/°C$ to $9\times10^{-6}/°C$. in a temperature range from 0° C. to 300° C.

The second coefficient of thermal expansion is preferably from $9\times10^{-6}/°C$. to $13\times10^{-6}/°C$., particularly preferably from $10\times10^{-6}/°C$. to $11.5\times10^{-6}/°C$. in a temperature range from 0° C. to 300° C.

The electrically conductive structure according to the invention has, preferably, a layer thickness of 5 μm to 40 μm, particularly preferably from 5 μm to 20 μm, very particularly preferably, from 8 μm to 15 μm and, most particularly, from 10 μm to 12 μm. The electrically conductive structure according to the invention contains, preferably, silver, particularly preferably, silver particles and glass frits.

The layer thickness of the solder according to the invention is $<3.0\times10^{-4}$ m.

The solder material is preferably leadfree, i.e., contains no lead. This is particularly advantageous with regard to the environmental impact of the pane with an electrical connection element according to the invention. Leadfree solder materials typically have less ductility than lead-containing solder materials, such that mechanical stresses between a connection element and a pane can be less well compensated. However, it has been demonstrated that critical mechanical stresses can be avoided by means of the connection element according to the invention. The solder material according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, or mixtures thereof.

The connection element according to the invention contains preferably at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and/or 0 wt.-% to 1 wt.-% titanium. In addition, the connection element can contain admixtures of other elements, including vanadium, aluminum, and nitrogen.

In another preferred embodiment, the connection element according to the invention contains at least 65 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, 0 wt.-% to 1 wt.-% niobium, and/or 0 wt.-% to 1 wt.-% titanium. In addition, the connection element can contain admixtures of other elements, including vanadium, aluminum, and nitrogen.

In another, particularly preferred embodiment, the connection element according to the invention contains at least 75 wt.-% to 84 wt.-% iron, 16 wt.-% to 18.5 wt.-% chromium, 0 wt.-% to 0.1 wt.-% carbon, 0 wt.-% to 1 wt.-% manganese, and/or 0 wt.-% to 1 wt.-% titanium. In addition, the connection element can contain admixtures of other elements, including vanadium, aluminum, niobium, and nitrogen.

The connection element according to the invention can also contain at least 78.5 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, and/or 0 wt.-% to 1 wt.-% titanium. In addition, the connection element can contain admixtures of other elements, including vanadium, aluminum, and nitrogen.

The connection element according to the invention is coated, preferably, with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current carrying capacity and corrosion stability of the connection element and the wetting with the solder material.

The connection element according to the invention contains preferably a chromium-containing steel with a proportion of chromium greater than or equal to 10.5 wt.-% and a coefficient of thermal expansion of $9\times10^{-6}/°C$. to $13\times10^{-6}/°C$. Further alloy components such as molybdenum, manganese, or niobium result in improved corrosion stability or altered mechanical properties, such as tensile strength or cold formability.

The advantage of connection elements made of chromium-containing steel compared to connection elements according to the prior art made of titanium resides in the better solderability. It results from the higher thermal conductivity of 25 W/nnK to 30 W/nnK compared to the thermal conductivity of titanium of 22 W/rinK. The higher thermal conductivity results in a more uniform heating of the connection element during the soldering process, by means of which the pointwise formation of particularly hot sites ("hot spots") is avoided. These sites are starting points for mechanical stresses and subsequent damage of the pane. Improved adhesion of the connection element to the pane results, in particular with the use of a leadfree solder material that can compensate mechanical stresses less well due to its lower ductility compared to lead-containing solder materials. Chromium-containing steel is, moreover, well weldable. With it, better connecting of the connection element to the onboard electronics via an electrically conductive material, e.g., copper, by welding, is possible. Due to the better cold formability, the connection element can also be better crimped with the electrically conductive material. Chromium-containing steel is, moreover, more available.

A further advantage of connection elements made of chromium-containing steel resides in the high rigidity compared to many conventional connection elements. Because of it, the connection element can be less readily deformed, for example, under load from pulling on a wire connected to the connection element. Such a deformation results in a load on the connection between a connection element and an electrically conductive structure via the solder material. In particular, with leadfree solder materials, such a load must be avoided. The load can be less well compensated as a result of the lower ductility of the leadfree solder material compared to lead-containing solder materials, which can lead to damage to the pane.

The chromium-containing steel can also be welded, crimped, or glued as a compensation plate on a connection element made, for example, of steel, aluminum, titaniumium, copper. As a bimetal, favorable expansion behavior of the connection element relative to the glass expansion can be obtained. The compensation plate is preferably hat-shaped.

The electrical connection element contains, on the surface facing the solder material, a coating that contains copper, zinc, tin, silver, gold, or alloys or layers thereof, preferably silver. This prevents a spreading of the solder material out beyond the coating and limits the outflow width.

The electrical connection element can be designed in the form of a bridge with at least two contact surfaces, but also as a connection element with one contact surface.

The connection elements are, in the plan view, for example, preferably 1 mm to 50 mm long and wide and, particularly preferably 3 mm to 30 mm long and wide and, very particularly preferably 2 mm to 5 mm wide and 12 mm to 24 mm long.

The shape of the electrical connection element can form solder depots in the intermediate space of the connection element and the electrically conductive structure. The solder depots and wetting properties of the solder on the connection element prevent the outflow of the solder material from the intermediate space. The solder depots can be rectangular, rounded, or polygonal in design.

The distribution of the soldering heat and, thus, the distribution of the solder material during the soldering process can be defined by the shape of the connection element. Solder material flows to the warmest point. For example, the bridge can have a single or double hat shape in order to distribute the heat advantageously in the connection element during the soldering process.

The introduction of the energy during the electrical connecting of an electrical connection and an electrically conductive structure occurs preferably by means of punches, thermodes, piston soldering, preferably laser soldering, hot air soldering, induction soldering, resistance soldering, and/or with ultrasound.

The object of the invention is further accomplished through a method for production of a pane with at least one connection element, wherein a) solder material is applied on the contact surfaces of the connection element as a platelet with a fixed layer thickness, volume, shape, and arrangement, b) an electrically conductive structure is applied to a substrate, c) the connection element with the solder material is arranged on the electrically conductive structure, and d) the connection element is soldered to the electrically conductive structure.

The solder material is preferably applied in advance to the connection elements, preferably as a platelet with a fixed layer thickness, volume, shape, and arrangement on the connection element.

The connection element can, for example, be welded or crimped to a sheet, a braided wire, a mesh made, for example, of copper and connected to the onboard electrical system.

The connection element is preferably used in heated panes or in panes with antennas in buildings, in particular, in automobiles, railroads, aircraft, or watercraft. the connection element serves to connect the conducting structures of the pane to electrical systems that are arranged outside the pane. The electrical systems are amplifiers, control units, or voltage sources.

A preferred embodiment of the invention is a pane with a connection element, wherein the contact surface of the connection element has no corners. The electrical connection element is connected over its entire surface to a subregion of the electrically conductive structure via one contact surface. The contact surface can have an oval, preferably an elliptical, and, in particular, a circular structure. Alternatively, the contact surface can have a convex polygonal shape, preferably a rectangular shape, with rounded corners. The rounded corners have a radius of curvature of $r>0.5$ mm, preferably of $r>1$ mm.

Figure 1A:
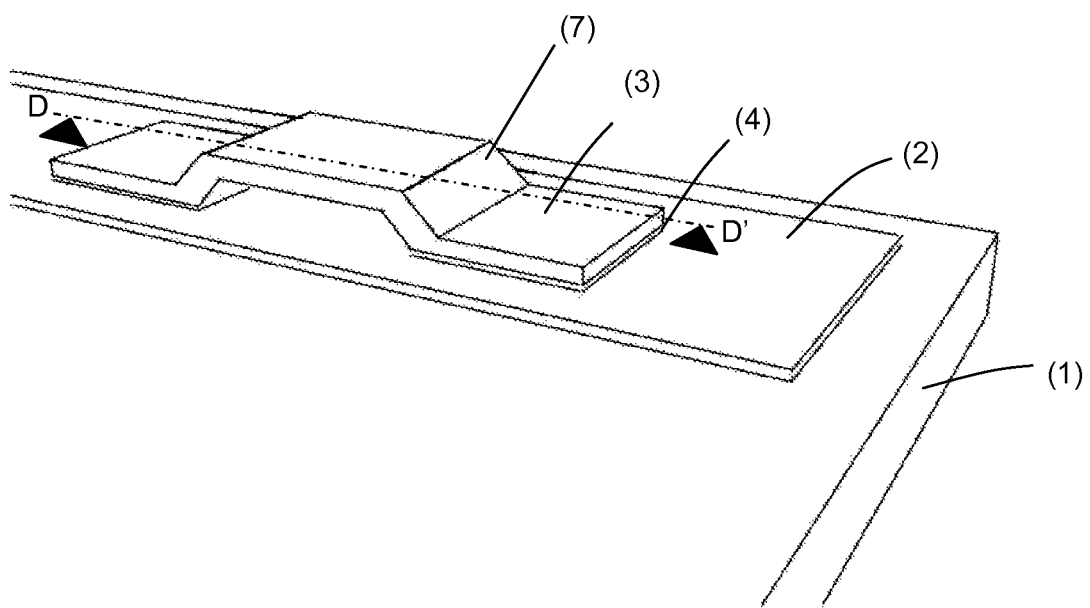
Figure 2:
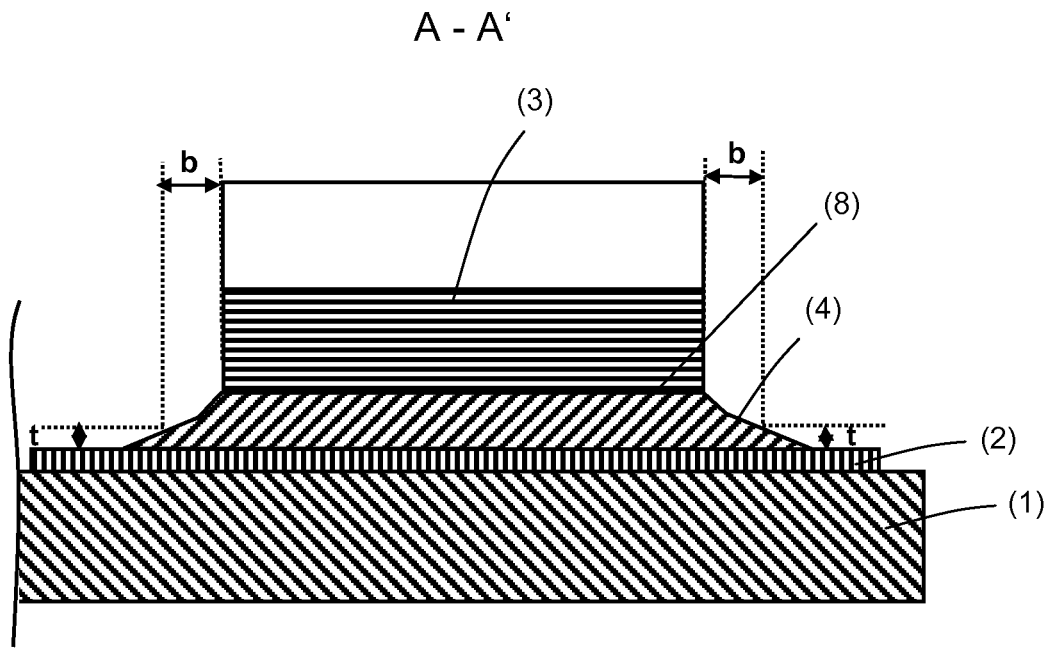
Figure 3:
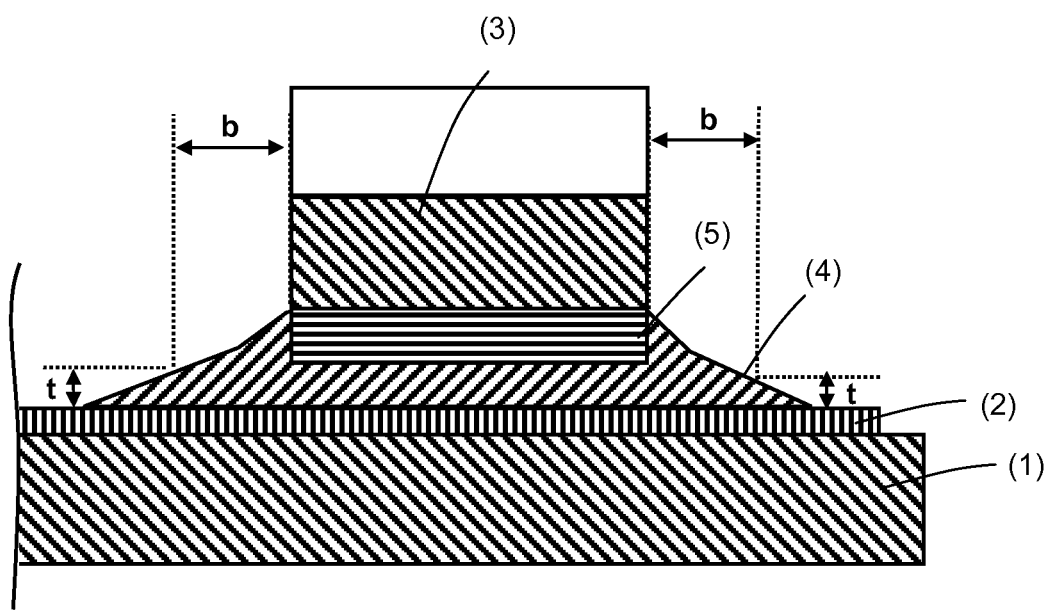
Figure 4:
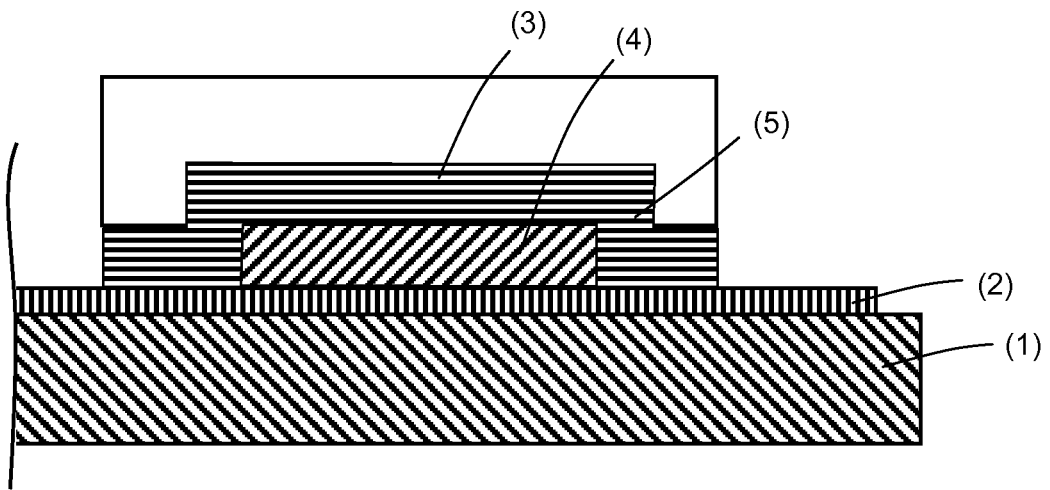
Figure 5:
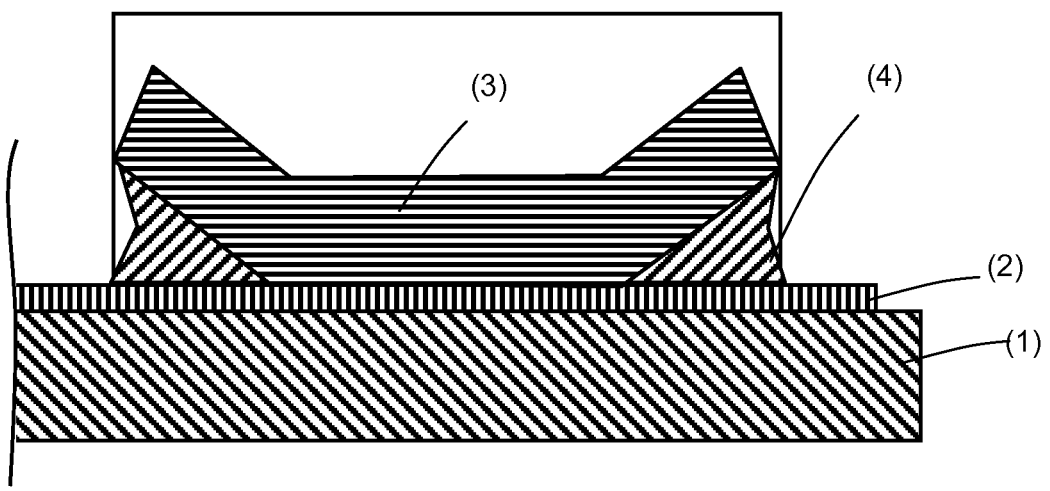
Figure 6:
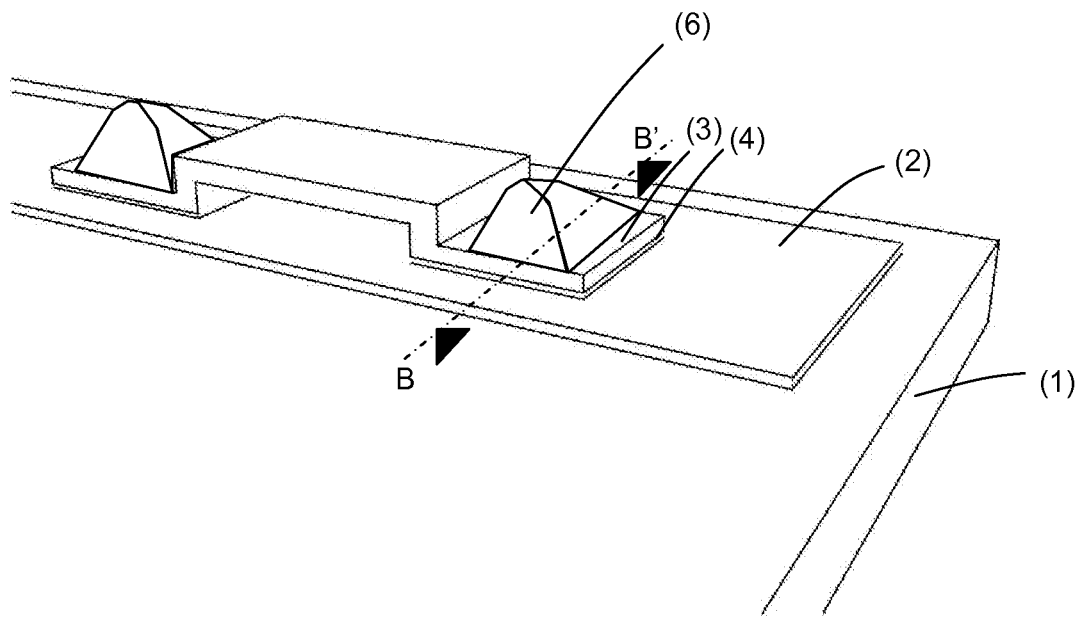
Figure 7:
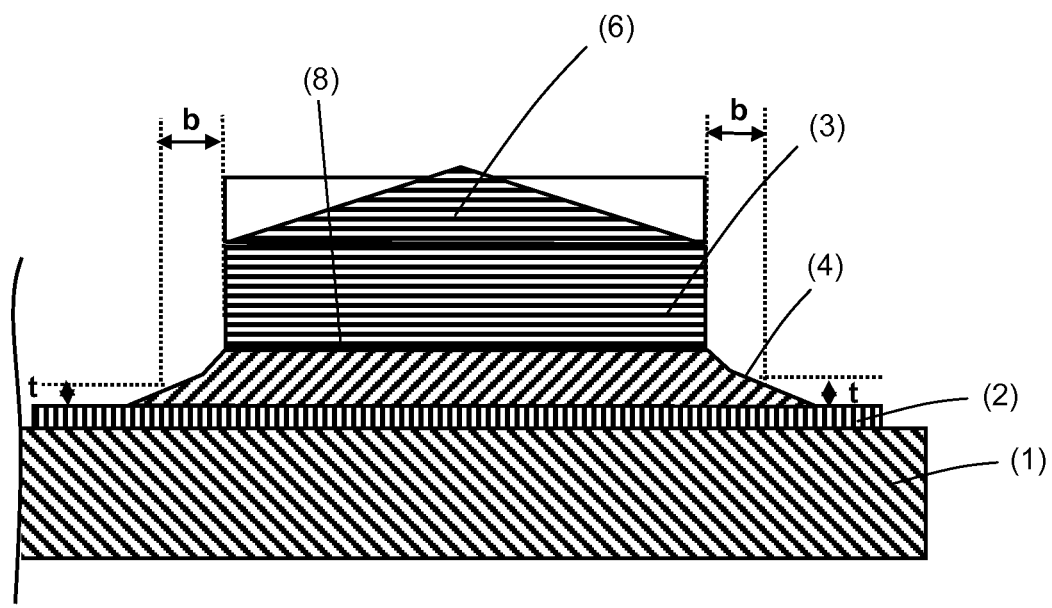
Figure 8:
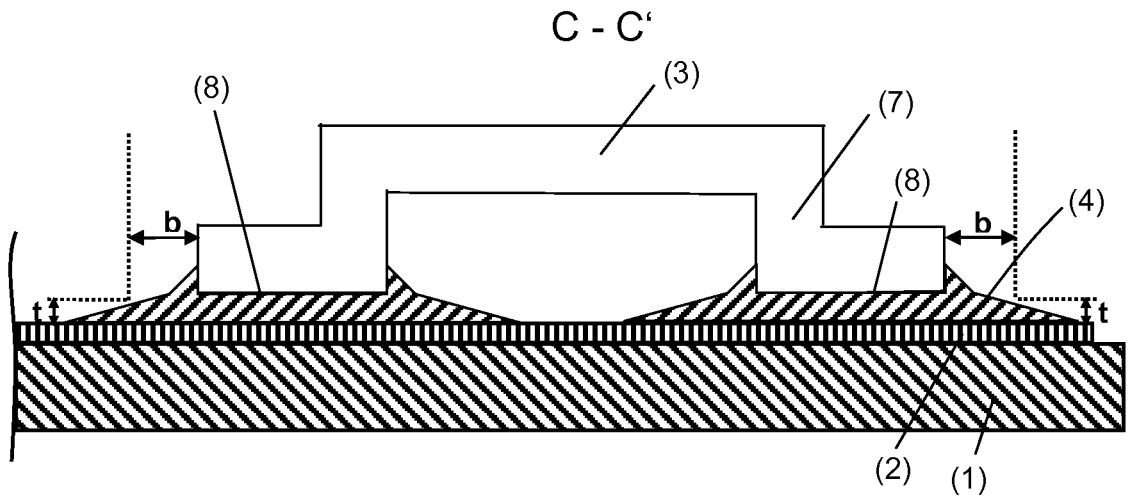
Figure 9:
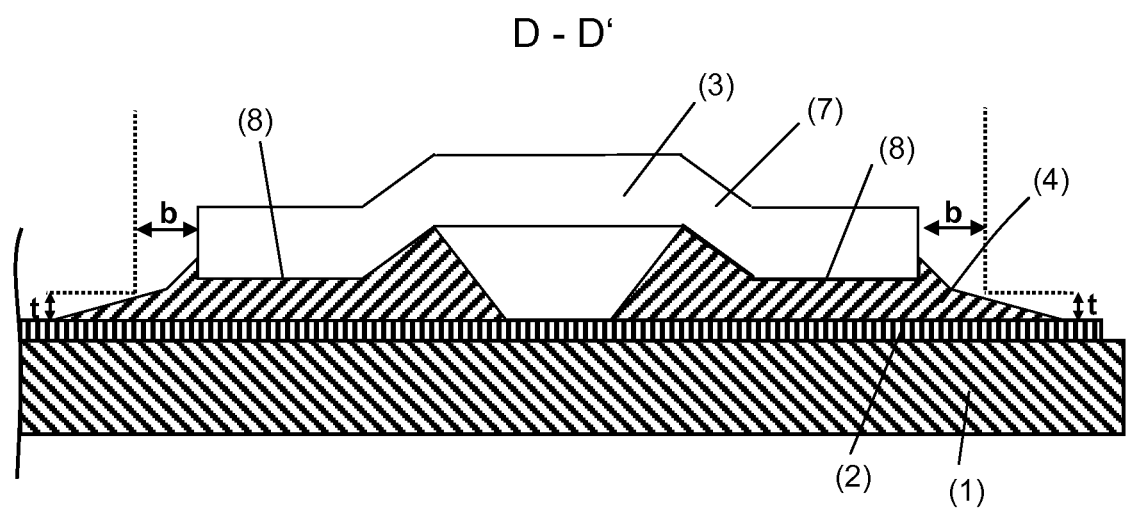
Figure 9A:
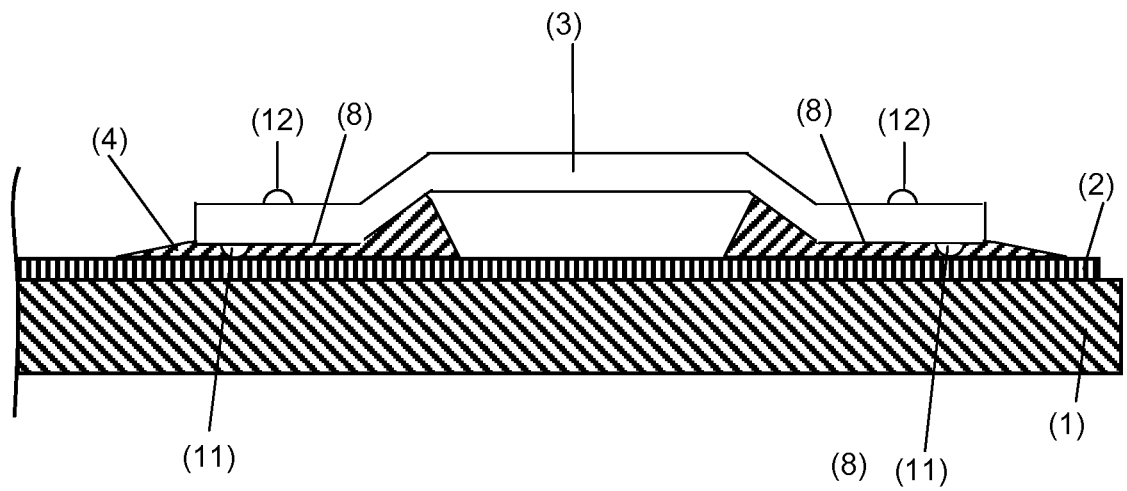
Figure 9B:
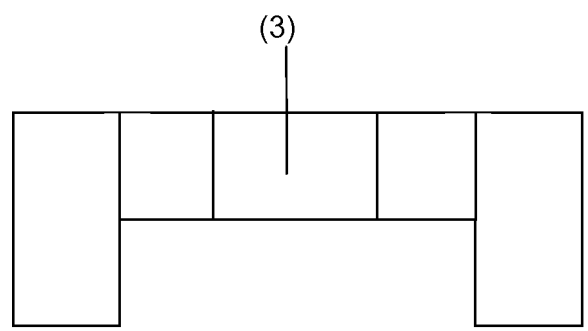
Figure 10:
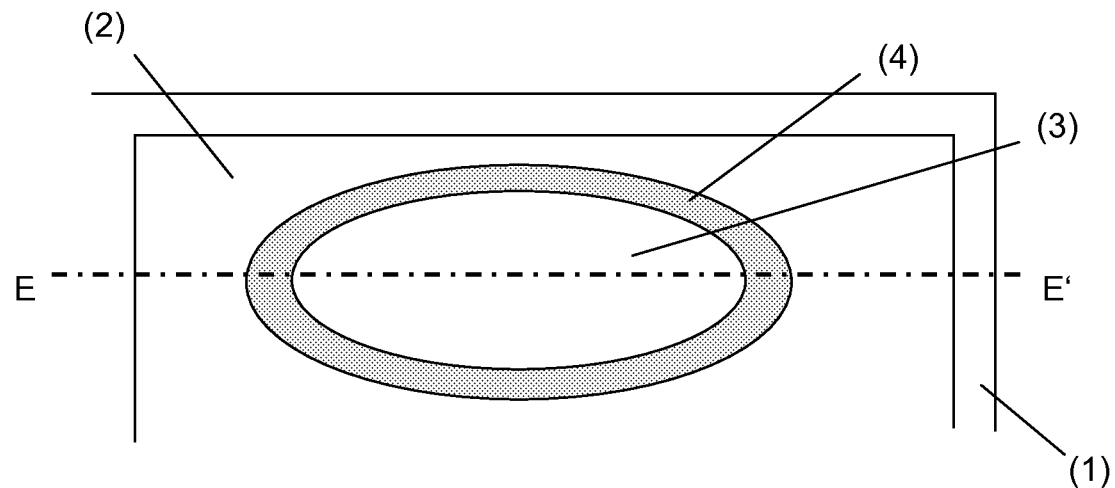
Figure 11:
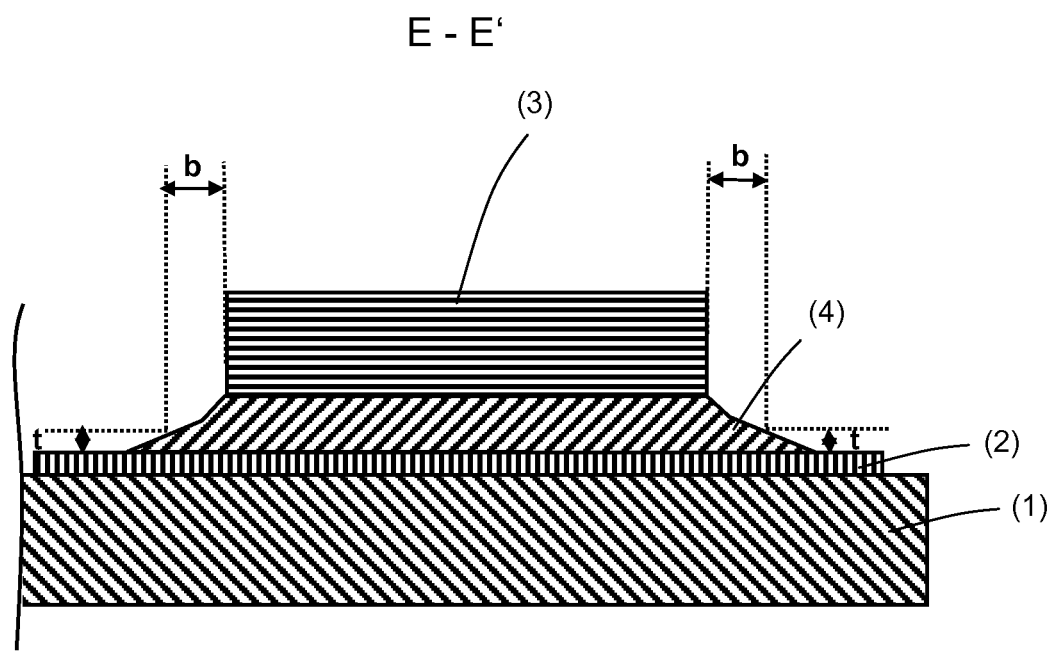
Figure 12:
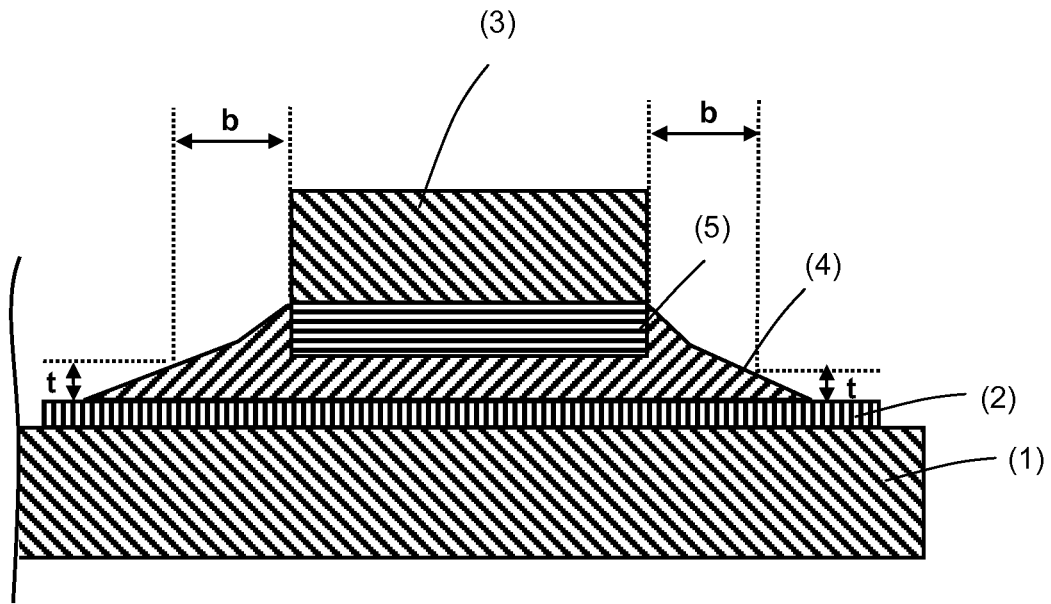
Figure 13:
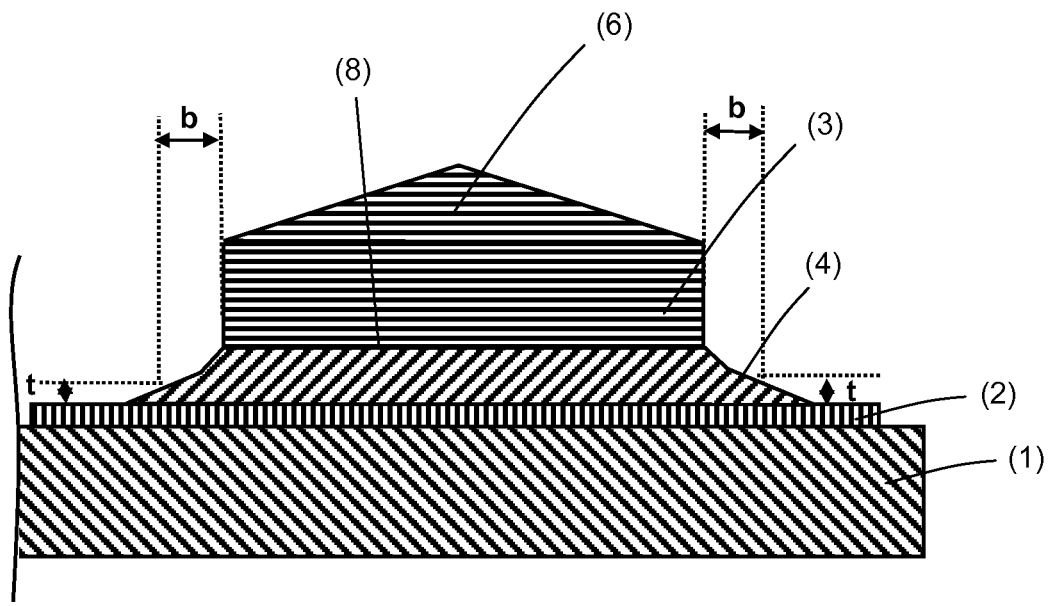
Figure 14:
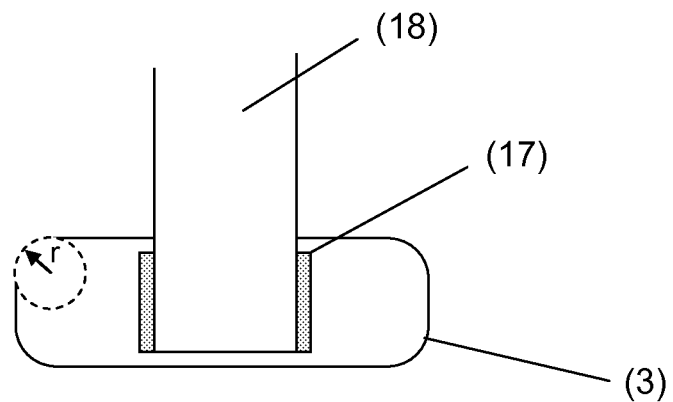
Figure 15:
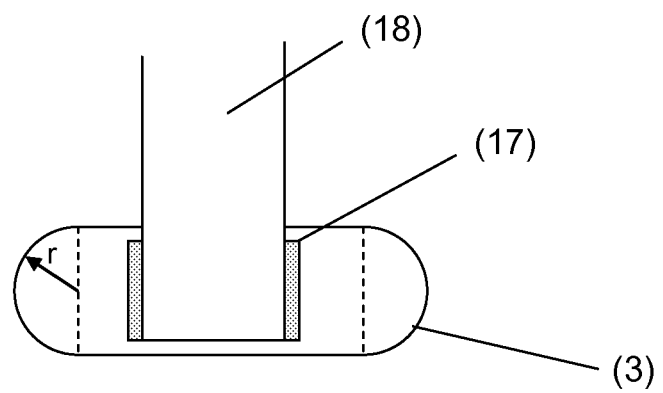
Figure 16:
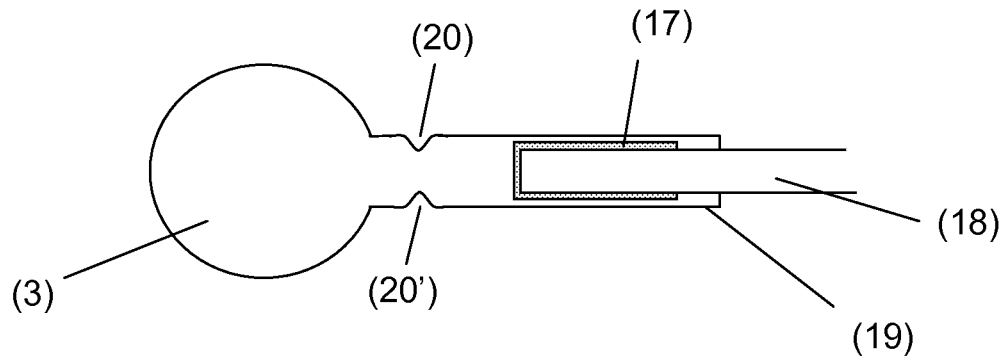
Figure 17:
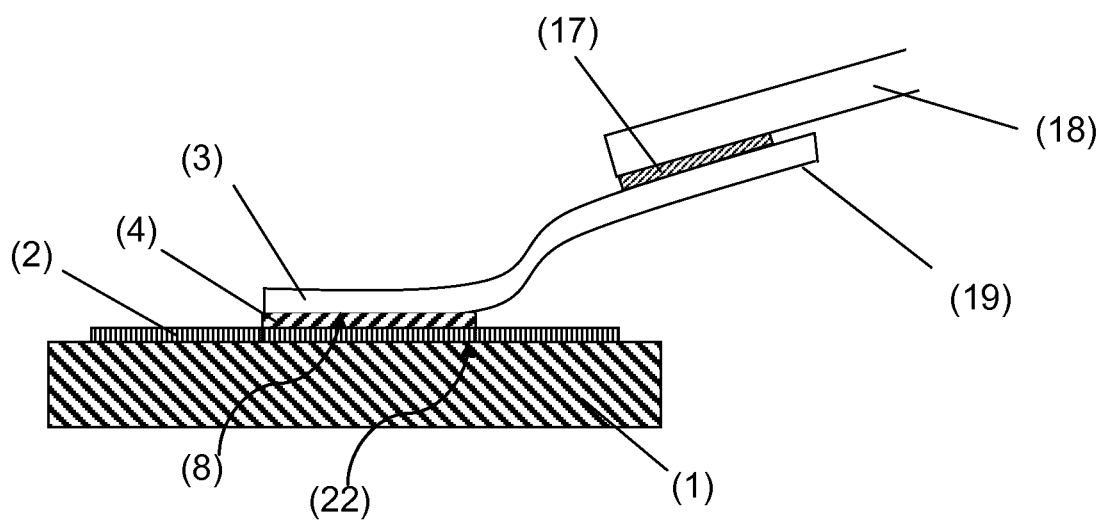
Figure 18:
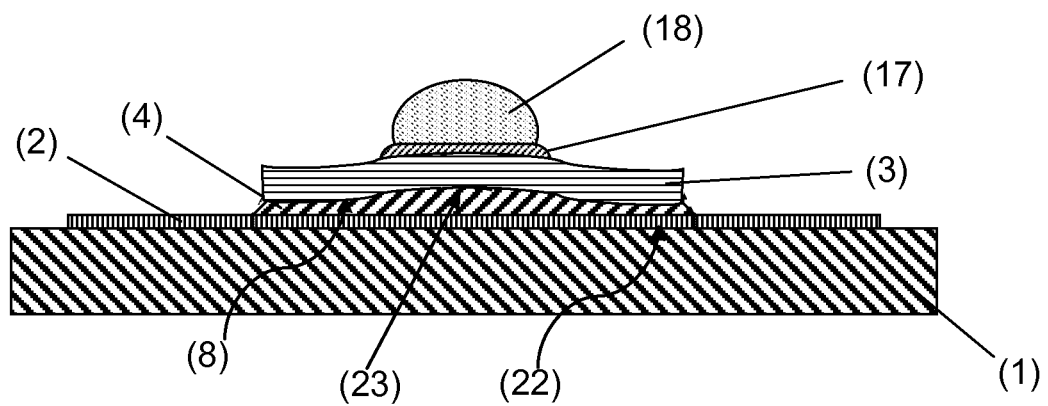
Figure 19:
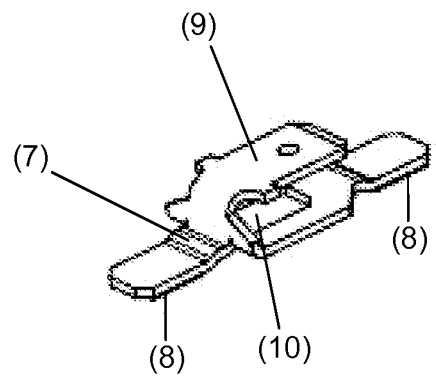
Figure 20:
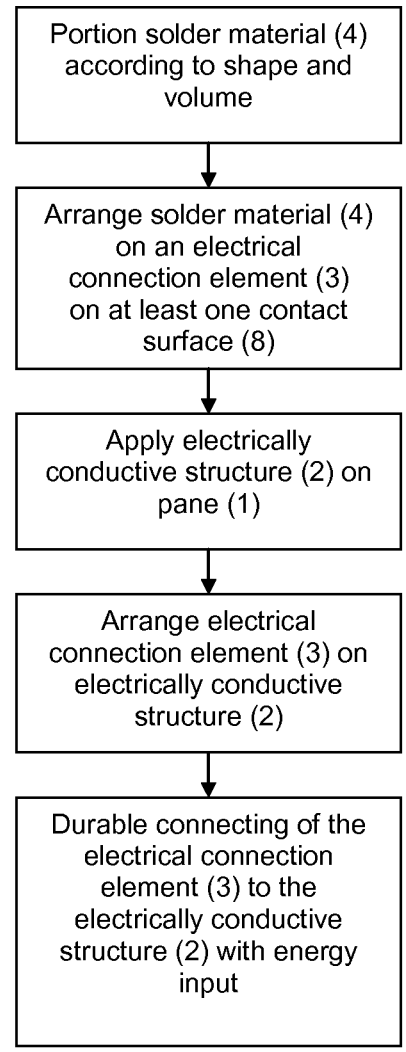

The invention is explained in detail with reference to drawings and exemplary embodiments. They depict:

FIG. 1 a perspective view of a first embodiment of the pane according to the invention, FIG. 1a a perspective view of an alternative embodiment of the pane according to the invention, FIG. 2 a cross-section A-A' through the pane of FIG. 1, FIG. 3 a cross-section through an alternative pane according to the invention, FIG. 4 a cross-section through another alternative pane according to the invention, FIG. 5 a cross-section through another alternative pane according to the invention, FIG. 6 a perspective view of an alternative embodiment of the pane according to the invention, FIG. 7 a cross-section B-B' through the pane of FIG. 6, FIG. 8 a cross-section C-C' through the pane of FIG. 1, FIG. 9 a cross-section D-D' through the pane of FIG. 1a, FIG. 9a a cross-section through an alternative embodiment of the pane according to the invention, FIG. 9b a plan view of an alternative embodiment of the connection element, FIG. 10 a plan view of an alternative embodiment of the of the pane according to the invention with an elliptical connection element, FIG. 11 a cross-section E-E' through the pane of FIG. 10, FIG. 12 a cross-section through an alternative pane according to the invention, FIG. 13 a cross-section through another alternative pane according to the invention, FIG. 14 a plan view of an alternative embodiment of the connection element, FIG. 15 a plan view of another alternative embodiment of the connection element, FIG. 16 a plan view of another alternative embodiment of the connection element, FIG. 17 a side view of the connection element of FIG. 16, and FIG. 18 a cross-section through another alternative pane according to the invention with a curved connection element, FIG. 19 a perspective view of another alternative embodiment of the connection element, and FIG. 20 a detailed flow chart of the method according to the invention.

FIG. 1, FIG. 2, and FIG. 8 show, in each case, a detail of a heatable pane 1 according to the invention in the region of the electrical connection element 3. The pane 1 is a 3-mm-thick thermally prestressed single-pane safety glass made of soda lime glass. The pane 1 has a width of 150 cm and a height of 80 cm. An electrically conductive structure 2 in the form of a heating conductor structure 2 is printed on the pane 1. The electrically conductive structure 2 contains silver particles and glass frits. In the edge region of the pane 1, the electrically conductive structure 2 is widened to a width of 10 mm and forms a contact surface for the electrical connection element 3. In the edge region of the pane 1, there is also a covering serigraph (not shown). In the region of the contact surface 8 between the electrical connection element 3 and the electrically conductive structure 2, solder material 4 is applied, which effects a durable electrical and mechanical connection between the electrical connection element 3 and the electrically conductive structure 2. The solder material 4 contains 57 wt.-% bismuth, 40 wt.-% tin, and 3 wt.-% silver. The solder material 4 is arranged through a predefined volume and shape completely between the electrical connection element 3 and the electrically conductive structure 2. The solder material 4 has a thickness of 250 μm. The electrical connection element 3 is made from steel of the material number 1.4509 in accordance with EN 10 088-2 (ThyssenKrupp Nirosta® 4509) with a coefficient of thermal expansion of $10.0 \times 10^{-6}/°C$. The electrical connection element 3 is designed in the form of a bridge and has a width of 4 mm and a length of 24 mm.

Steel of the material number 1.4509 in accordance with EN 10 088-2 has good cold forming properties and good welding properties with all methods except gas welding. The steel is used for construction of sound suppressor systems and exhaust gas detoxification systems and is particularly suited for that due to its scaling resistance to more than 950° C. and corrosion resistance against the stresses occurring in the exhaust gas system. However, other chromium-containing steels can be used for the connection element 3. One alternative particularly suitable steel is, for example, material number 1.4016 in accordance with EN 10 088-2.

FIG. 1a and FIG. 9 depict, in each case, a detail of an alternative embodiment of the heatable pane 1 according to the invention in the region of the electrical connection element 3. The region 7 of the connection element 3 in the form of a bridge is formed at an angle to the surface of the pane. By this means, due to the capillary effect, a thicker layer of solder material 4 is obtained in the volume that is delimited by the electrically conductive structure 2 and region 7 of the connection element. The solder material outflow on the outer edges of the connection element is thus reduced, advantageously resulting in a reduction of the mechanical stresses in the pane. This is particularly advantageous with the use of a leadfree solder material that can compensate chemical stresses less well due to its lower ductility compared to lead-containing solder materials. The height-adapting region 7 of the connection element 3 in the form of a bridge does not necessarily have to be configured as a flat segment, but can, instead, also be curved. The angle between the surface of the substrate 1 and each of the tangential planes of the surfaces of the region 7 facing the substrate 1 is preferably less than 90°, particularly preferably between 2° and 75°, very particularly preferably between 5° and 50°.

FIG. 3 depicts, in continuation of the exemplary embodiment of FIGS. 1 and 2, an alternative embodiment of the connection element 3 according to the invention. The electrical connection element 3 is provided on the surface facing the solder material 4 with a silver-containing coating 5. This prevents spreading of the solder material out beyond the coating 5 and limits the outflow width b. In another embodiment, an adhesion-promoting layer made, for example, of nickel and/or copper, can be located between the connection element 3 and the silver-containing layer 5. The outflow width b of the solder material 4 is less than 1 mm. No critical mechanical stresses are observed in the pane 1 due to the arrangement of the solder material 4. The connection of the pane 1 to the electrical connection element 3 via the electrically conductive structure 2 is durably stable.

FIG. 4 depicts, in continuation of the exemplary embodiment of FIGS. 1 and 2, another alternative embodiment of the connection element 3 according to the invention. The electrical connection element 3 contains, on the surface facing the solder material 4, a recess with a depth of 250 μm that forms a solder depot for the solder material 4. It is possible to completely prevent outflow of the solder material 4 from the intermediate space. The thermal stresses in the pane 1 are noncritical and a durable electrical and mechanical connection is provided between the connection element 3 and the pane 1 via the electrically conductive structure 2.

FIG. 5 depicts, in continuation of the exemplary embodiment of FIGS. 1 and 2, another alternative embodiment of the connection element 3 according to the invention. The electrical connection element 3 is bent upward on the edge regions. The height of the upward bend of the edge region of the glass pane 1 is a maximum of 400 μm. This forms a space for the solder material 4. The predefined solder material 4 forms a concave meniscus between the electrical connection element 3 and the electrically conductive structure 2. It is possible to completely prevent outflow of solder material 4 from the intermediate space. The outflow width b, at roughly 0, is less than zero, largely because of the meniscus formed. The thermal stresses in the pane 1 are noncritical, and a durable electrical and mechanical connection is provided between the connection element 3 and the pane 1 via the electrically conductive structure 2.

FIG. 6 and FIG. 7 depict, in each case, a detail of another embodiment of the pane 1 according to the invention with connection element 3 in the form of a bridge. The connection element 3 contains an iron-containing alloy with a coefficient of thermal expansion of $8 \times 10^{-6}/°C$. The material thickness is 2 mm. In the region of the contact surface 8 of the connection element 3 with the electrically conductive structure 2, hat-shaped compensation members 6 are applied with chromium-containing steel of the material number 1.4509 in accordance with EN 10 088-2 (ThyssenKrupp Nirosta® 4509). The maximum layer thickness of the hat-shaped compensation members 6 is 4 mm. By means of the compensation members, it is possible to adapt the coefficients of thermal expansion of the connection element 3 to the requirements of the pane 1 and of the solder material 4. The hat-shaped compensation members 6 result in improved heat flow during the production of the solder connection 4. The heating occurs primarily in the center of the contact surface 8. It is possible to further reduce the outflow width b of the solder material 4. Because of the low outflow width b of <1 mm and the adapted coefficient of expansion, it is possible to further reduce the thermal stresses in the pane 1. The thermal stresses in the pane 1 are noncritical, and a durable electrical and mechanical connection is provided between the connection element 3 and the pane 1 via the electrically conductive structure 2.

FIG. 9a depicts, in continuation of the exemplary embodiment of FIGS. 1a and 9, an alternative embodiment of the connection element 3 according to the invention. On each of the surfaces of the flat foot region of the connection element 3 facing away from the substrate 1 opposite the contact surface 8, a contact bump 12 is arranged. The contact bumps 12 are formed, in the embodiment shown, as hemispheres and have a height of $2.5 \times 10^{-4}$ m and a width of $5 \times 10^{-4}$ m. The centers of the contact bumps 12 are arranged roughly in the geometric center of the surfaces of the flat foot regions of the connection element 3 facing away from the substrate 1. Because of their convex surface, the contact bumps 12 enable an advantageously improved soldering of the connection element to the electrically conductive structure 2. For the soldering, electrodes whose contact side is flat can be used. The electrode surface is brought into contact with the contact bump 12, with the contact region between the electrode surface and the contact bump 12 forming the soldering point. The position of the soldering point is thus determined preferably by the point on the convex surface of the contact bump 12 that has the greatest vertical distance from the surface of the substrate 1. The position of the soldering point is independent of the position of the solder electrode on the connection element 3. That is particularly advantageous with regard to a reproducible, uniform heat distribution during the soldering process.

The heat distribution during the soldering process is determined by the position, the size, the arrangement, and the geometry of the contact bump 12. In alternative embodiments, the contact bump 12 can be shaped, for example, as a segment of a rotational ellipsoid or as a cuboid, with the surface of the cuboid turned away from the substrate curved convexly. The contact bumps 12 preferably have a height of 0.1 mm to 2 mm, particularly preferably of 0.2 mm to 1 mm. The length and width of the contact bumps 12 is preferably between 0.1 and 5 mm, very particularly preferably between 0.4 mm and 3 mm.

Spacers 11 are arranged on each of the contact surfaces 8. Three spacers 11, for example, of which one spacer 11 is discernible in the cross-section depicted in the figure, can be arranged on each contact surface 8. The spacers 11 are shaped as hemispheres and have a height of $2.5 \times 10^{-4}$ m and a width of $5 \times 10^{-4}$ m. The spacers 11 can, in alternative embodiments, also be designed as a cube, as a pyramid, or as a segment of a rotational ellipsoid and preferably have a width of $0.5 \times 10^{-4}$ m to $10 \times 10^{-4}$ m and a height of $0.5 \times 10^{-4}$ m to $5 \times 10^{-4}$ m, particularly preferably of $1 \times 10^{-4}$ m to $3 \times 10^{-4}$ m. By means of the spacers 11, the formation of a uniform layer of solder material 4 is favored. That is particularly advantageous with regard to the adhesion of the connection element 3.

The contact bumps 12 and spacers 11 can, in an advantageous embodiment, be formed in one piece with the connection element 3. The contact bumps 12 and the spacers 11 can, for example, be formed by reshaping a connection element 3 with a flat surface in the initial state on the surface, for example, by stamping or deep drawing. In the process, a corresponding depression can be created on the surface of the connection element 3 opposite the contact bump 12 or the spacer 11.

By means of the contact bumps 12 and the spacers 11, a homogeneous, uniformly thick, and uniformly fuzed layer of the solder material 4 is obtained. Thus, mechanical stresses between the connection element 3 and substrate 1 can be reduced. This is particularly advantageous with the use of a leadfree solder material that can compensate mechanical stresses less well due to its lower ductility compared to lead-containing solder materials.

FIG. 9b depicts, in continuation of the exemplary embodiment of FIG. 1a and 9, a plan view of an alternative embodiment of the connection element 3 according to the invention. The connection element 3 is designed in the form of a bridge and has a cross-section in accordance with FIG. 9. The boundaries between the flat subsections are indicated in the plan view by dotted lines. The flat foot regions of the connection element 3, on the bottom of which the contact surfaces 8 are arranged, have a width of 8 mm and are twice as wide as the bridge region between the foot regions. It has surprisingly been demonstrated that foot regions that are designed wider than the bridge region result in a reduction of mechanical stresses in the pane 1. The width of the foot regions is preferably from 150% to 300% of the width of the bridge region.

FIG. 10 and FIG. 11 show, in each case, a detail of another embodiment of the heatable pane 1 according to the invention in the region of the electrical connection element 3. An outflow of the solder material 4 from the intermediate space between the electrical connection element 3 and the electrically conductive structure 2, which exceeds a layer thickness t of 50 μm, is observed to a maximum outflow width of b=0.5 mm. The electrical connection element 3 is made from steel of the material number 1.4509 in accordance with EN 10 088-2 (ThyssenKrupp Nirosta® 4509). The electrical connection element 3 is designed with an elliptical base surface. The length of the major axis is 12 mm; the length of the minor axis, 5 mm. The material thickness of the connection element 3 is 0.8 mm. No critical mechanical stresses are observed in the pane 1 due to the arrangement of the solder material 4, predefined by the connection element 3 and the electrically conductive structure 2. The connection of the pane 1 to the electrical connection element 3 via the electrically conductive structure 2 is durably stable.

FIG. 12 shows, in continuation of the exemplary embodiment of FIGS. 10 and 11, an alternative embodiment of the connection element 3 according to the invention. The electrical connection element 3 is provided on the surface facing the solder material 4 with a silver-containing coating 5. This prevents spreading of the solder material out beyond the coating 5 and limits the outflow width b. The outflow width b of the solder material 4 is less than 1 mm. No critical mechanical stresses are observed in the pane 1 due to the arrangement of the solder material 4. The connection of the pane 1 to the electrical connection element 3 via the electrically conductive structure 2 is durably stable.

FIG. 13 shows, in continuation of the exemplary embodiment of FIGS. 10 and 11, another alternative embodiment of the pane 1 according to the invention with a connection element 3 with an elliptical base surface. The connection element 3 contains an iron-containing alloy with a coefficient of thermal expansion of $8 \times 10^{-6}$/°C. The material thickness is 2 mm. In the region of the contact surface 8 of the connection element 3 with the electrically conductive structure 2, a hat-shaped compensation member 6 is applied with chromium-containing steel of the material number 1.4509 in accordance with EN 10 088-2 (ThyssenKrupp Nirosta® 4509). The maximum layer thickness of the hat-shaped compensation member 6 is 4 mm. By means of the compensation member, it is possible to adapt the coefficients of thermal expansion of the connection element 3 to the requirements of the pane 1 and of the solder material 4. The hat-shaped compensation members 6 results in improved heat flow during the production of the solder connection 4. The heating occurs primarily in the center of the contact surface 8. It is possible to further reduce the outflow width b of the solder material 4. Because of the low outflow width b of <1 mm and the adapted coefficient of expansion, it is possible to further reduce the thermal stresses in the pane 1. The thermal stresses in the pane 1 are noncritical, and a durable electrical and mechanical connection is provided between the connection element 3 and the pane 1 via the electrically conductive structure 2.

FIG. 14 depicts a plan view of an alternative embodiment of the connection element 3 according to the invention. The connection element 3 is designed as a rectangle and has a width of 5 mm and a length of 14 mm. The corners of the rectangle are in each case rounded with a circular segment with a radius curvature r of 1 mm, for example. Furthermore, a connection cable 18 is welded via a welding region 17 to the connection element 3. The welding region 17 has a width of 3 mm and a length of 6 mm. The connection cable 18 is a woven cable made of thin, tin-plated copper wires. Stranded wire cables or wires can also be used as the connection cable 18. Alternatively, metal sleeves, plug connectors, or crimp connections can also be electrically conductively connected to the connection element 3. In particular, the connection element 3 can also be designed as a one-part or multi-part clamping sleeve or crimp element.

FIG. 15 depicts a plan view of another alternative embodiment of the connection element 3 according to the invention. The connection element 3 is designed as a rectangle, with the two short sides of the rectangle designed as semicircles. The connection element has a width of 5 mm and a length of 14 mm. The welding region 17 has a width of 3 mm and a length of 6 mm.

FIG. 16 and FIG. 17 depict another alternative embodiment of the connection element 3 according to the invention with a connecting tab 19. The contact surface 8 of the connection element 3 is designed as a circle. The radius of the circle is 4 mm. The connecting tab 19 is connected via a welding region 17 to a connection cable 18. Alternatively, the connecting tab 19 can also be designed as a flat plug as well as a clamping sleeve or crimp connector. The connecting tab 19 has, in this embodiment, two notches 20, 20'. These notches 20, 20' serve to reduce the material of the connecting tab 19. This results in a spring effect and thus to the mitigation of forces that are transferred via the connection cable 18 to the solder contact.

FIG. 18 depicts a cross-section through another alternative embodiment of a connection element 3 according to the invention. The connection element 3 has a curve 23 in the center. In the region of the curve 23, the solder material 4 is thickened.

FIG. 19 depicts a perspective view of an alternative embodiment of the connection element 3 according to the invention. The connection element 3 is designed in the form of a bridge and has a first and second flat foot region with, for example, a length of 7 mm and a width of 5 mm, on the bottom of which the two contact surfaces 8 are arranged. The flat foot regions are connected to each other via a bridge region that comprises a flat section with, for example, a length of 12 mm and a width of 10 mm. The flat section of the bridge region has a production-related indentation 10. The indentation 10 runs all the way to the edge of the flat section of the bridge region, to which the first foot region is connected via a height-adapting transition region 7. The indentation 10 corresponds in shape and size to the section of the connection element 3 from the first foot region and the height-adapting transition region 7. The contact surfaces 8 have a rectangular shape, with the two corners turned away from the bridge region beveled in each case. By means of the beveling, angles that are too small, in particular 90°-angles along the surrounding side edges of the contact surfaces 8 are avoided. It has been demonstrated that mechanical stresses in the pane can thus be reduced.

The connection element 3 includes a plug connector 9 arranged on the bridge region. The plug connector 9 is connected, on the side edge of the flat section of the bridge region facing the first foot region, to the flat section of the bridge region. The plug connector 9 is designed as a standardized tab connector to which the coupling of a connection cable (not shown) to the onboard electronics, for instance, can be attached.

The particular advantage of the embodiment of the invention resides in simple production of the connection element 3, providing, at the same time, a convenient interface for electrical contacting (plug connector 9). The foot regions, the bridge region, and the plug connector 9 are formed in one piece. The connection element 3 is provided in a flat initial state, in which the sections provided as the first foot region and height-adapting transition region 7 are arranged inside the indentation 10. In the initial state, the plug connector 9 is arranged in the same plane as the flat section of the bridge region. The region provided as the first foot region and the height-adapting transition region 7 can be separated from the flat section of the bridge region, for example, by punching, laser beam machining, or waterjet machining, with a connection remaining between the height-adapting transition region 7 and the flat section of the bridge region via the connecting edge. The plug connector 9 is bent around the connecting line between the plug connector 9 and the flat section of the bridge region into the position depicted, with the surface that faces upward in the initial state then facing the bridge region. The first foot region and the height-adapting transition region 7 are bent above the connecting line between the height-adapting transition region 7 and the flat section of the bridge region into the position depicted, with the surface that faces upward in the initial state then forming the bottom side of the first foot region and the height-adapting transition region 7. The indentation 10 is formed by the bending of the first foot region. The second foot region and the corresponding height-adapting transition region 7 are also bent from the flat initial state into the position depicted.

FIG. 20 depicts in detail a method according to the invention for manufacture of a pane 1 with an electrical connection element 3. An example of the method according to the invention for manufacture of a pane with an electrical connection element 3 is presented there. As the first step, it is necessary to portion the solder material 4 according to shape and volume. The portioned solder material 4 is arranged on the contact surfaces 8 of the electrical connection element 3. The electrical connection element 3 is arranged with the solder material 4 on the electrically conductive structure 2. A durable connection of the electrical connection element 3 to the electrically conductive structure 2 and, thus, to the pane 1 takes place through the input of energy.

EXAMPLE

Test specimens were produced with the pane 1 (thickness 3 mm, width 150 cm, and height 80 cm), the electrically conductive structure 2 in the form of a heating conductor structure, the electrical connection element 3 according to FIG. 1, the silver layer 5 on the contact surfaces 8 of the connection element 3, and the solder material 4. The material thickness of the connection element 3 was 0.8 mm. The contact surface 8 of the connection element 3 had a width of 4 mm and a length of 4 mm. The solder material 4 was applied in advance as a platelet with fixed layer thickness, volume, and shape on the contact surface 8 of the connection element 3. The connection element 3 was applied with the solder material 4 applied on the electrically conductive structure 2. The connection element 3 was soldered onto the electrically conductive structure 2 at a temperature of 200° C. and a processing time of 2 seconds. Outflow of the solder material 4 from the intermediate space between the electrical connection element 3 and the electrically conductive structure 2, which exceeded a layer thickness t of 50 µm, was observed only to a maximum outflow width of b=0.5 mm. The dimensions and compositions of the electrical connection element 3, the silver layer 5 on the contact surfaces 8 of the connection element 3, and the solder material 4 are found in Table 1. No critical mechanical stresses were observed in the pane 1 due to the arrangement of the solder material 4, predefined by the connection element 3 and the electrically conductive structure 2. The connection of the pane 1 to the electrical connection element 3 via the electrically conductive structure 2 was durably stable.

Due to the capillary effect, the connection element 3 of FIG. 1a exhibited better adhesion between the connection element 3 and the substrate 1. Due to the arrangement of the solder material 4, no critical mechanical stresses were observed in the pane 1. The connection of the pane 1 to the electrical connection element 3 via the electrically conductive structure 2 was durably stable.

With all specimens, it was possible to observe, with a temperature difference from +80° C. to −30° C., that no glass substrate 1 broke or showed damage. It was possible to demonstrate that, shortly after soldering, these panes 1 with the soldered connection element 3 were stable against a sudden temperature drop.

TABLE 1

| Components | Material | Example |
|---|---|---|
| Connection element 3 | Steel of material no. 1.4509 in accordance with EN 10 088-2 with the composition: | |
| | Iron (wt.-%) | 78.87 |
| | Carbon (wt.-%) | 0.03 |
| | Chromium (wt.-%) | 18.5 |
| | Titanium (wt.-%) | 0.6 |
| | Niobium (wt.-%) | 1 |
| | Manganese (wt.-%) | 1 |
| | CTE (coefficient of thermal expansion) ($10^{-6}$/° C. for 0° C.-100° C.) | 10 |
| | Difference between CTE of the connection element and substrate ($10^{-6}$/° C. for 0° C.-100° C.) | 1.7 |
| | Thermal conductivity (W/mK for 20° C.) | 25 |
| | Thickness of the connection element (m) | $8.0 \times 10^{-4}$ |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |

TABLE 1-continued

| Components | Material | Example |
|---|---|---|
| Glass substrate 1 (Soda lime glass) | CTE ($10^{-6}$/° C. for 0° C.-320° C.) | 8.3 |

COMPARATIVE EXAMPLE

The comparative example was carried out the same as the example. The difference resided in the use of a different material for the connection element 3. The connection element 3 was 100 wt.-% titanium. The connection element 3 thus had lower thermal conductivity, a lower coefficient of thermal expansion, and a smaller difference of the coefficients of thermal expansion between connection element 3 and substrate 1. The dimensions and components of the electrical connection element 3, the metal layer on the contact surfaces 8 of the connection element 3 and the solder material 4 are found in Table 2. The connection element 3 was soldered to the electrically conductive structure 2 in accordance with conventional methods by means of the solder material 4. With the outflow of the solder material 4 from the intermediate space between the electrical connection element 3 and the electrically conductive structure 2, which exceeded a layer thickness t of 50 µm, an average outflow width b=2 mm to 3 mm was obtained. The lower thermal conductivity of the material for the connection element resulted, in the comparative example, in a less uniform heating of the connection element during the soldering process.

With a sudden temperature difference from +80° C. to −30° C., it was observed that the glass substrates 1 had major damage shortly after soldering.

TABLE 2

| Components | Material | Comparative example |
|---|---|---|
| Connection element 3 | Titanium (wt.-%) | 100 |
| | CTE (coefficient of thermal expansion) ($10^{-6}$/° C. for 0° C.-100° C.) | 8.80 |
| | Difference between CTE of the connection element and substrate ($10^{-6}$/° C. for 0° C.-100° C.) | 0.5 |
| | Thermal conductivity (W/mK for 20° C.) | 22 |
| | Thickness of the connection element (m) | $8.0 \times 10^{-4}$ |
| Wetting layer 5 | Silver (wt.-%) | 100 |
| | Thickness of the layer (m) | $7.0 \times 10^{-6}$ |
| Solder material 4 | Tin (wt.-%) | 40 |
| | Bismuth (wt.-%) | 57 |
| | Silver (wt.-%) | 3 |
| | Thickness of the solder layer in (m) | $250 \times 10^{-6}$ |
| | The thickness of the wetting layer and the solder layer (m) | $257 \times 10^{-6}$ |
| Glass substrate 1 (Soda lime glass) | CTE ($10^{-6}$/° C. for 0° C.-320° C.) | 8.3 |

The differences from Tables 1 and 2 above and the advantages of the connection element 3 according to the invention are found in Table 3.

TABLE 3

|  | Embodiment according to the invention, Example | Comparative example |
|---|---|---|
| Material | Steel of material no. 1.4509 in accordance with EN 10 088-2 | Titanium |
| Thermal conductivity (W/mK for 20° C.) | 25 | 22 |
| CTE (coefficient of thermal expansion) of the connection element ($10^{-6}$/° C. for 0° C.-100° C.) | 10 | 8.8 |
| Difference between CTE of the connection element and the substrate ($10^{-6}$/° C. for 0° C.-100° C.) | 1.7 | 0.5 |

It was demonstrated that panes according to the invention with glass substrates 1 and electrical connection elements 3 according to the invention have better stability against sudden temperature differences. This result was unexpected and surprising for the person skilled in the art.

LIST OF REFERENCE CHARACTERS (1) Pane
(2) Electrically conductive structure
(3) Electrical connection element
(4) Solder material
(5) Wetting layer
(6) Compensation member
(7) Region of the electrical connection element 3
(8) Contact surface of the connection element 3 with the electrically conductive structure 2
(9) Plug connector
(10) Indentation
(11) Spacer
(12) Contact bump
(17) Welding region
(18) Connection cable
(19) Connecting tab
(20) Notch
(20') Notch
(22) Subregion of 2
(23) Curve
b Maximum outflow width of the solder material
t Limiting thickness of the solder material
r Radius of curvature
A-A' Section line
B-B' Section line
C-C' Section line
D-D' Section line
E-E' Section line

The invention claimed is:

1. A pane with at least one electrical connection element, comprising:
a substrate for applying an electrically conductive structure on a region of the substrate, the substrate having a first coefficient of thermal expansion from $8\times10^{-6}$/° C. to $9\times10^{-6}$/° C., and
a connection element of the at least one electrical connection element,
wherein the connection element contains at least chromium-containing steel, wherein the connection element has a second coefficient of thermal expansion from $10\times10^{-6}$/° C. to $11.5\times10^{-6}$/° C.,
wherein the connection element contains at least 50 wt.-% to 89.5 wt.-% iron, 16 wt.-% to 20 wt.-% chromium, and one or more selected from the group of carbon, nickel, manganese, molybdenum, and titanium,
wherein the difference between the first coefficient of thermal expansion of the substrate and the second coefficient of thermal expansion of the connection element is less than $<5\times10^{-6}$/° C.; and
a layer of a lead-free solder material,
wherein the layer of the lead-free solder material electrically connects the connection element to subregions of the electrically conductive structure,
wherein the connection element includes edge regions and is bent upwards on the edge regions to form an intermediate space in which the solder material is present, the intermediate space being formed by the connection element and the electrically conductive structure,
wherein a maximum outflow width of the solder material is negative so that the solder material is pulled back into the intermediate space,
wherein the maximum outflow width is defined as a distance between outer edges of the connection element and a point of the solder material crossover at which the solder material drops below a layer thickness of 50 µm and
wherein a first edge region of the edge regions includes a first end of a first inclined region of the first edge region connected to a flat central region of the first edge region and a free distal end of the first inclined region that is opposite the first end of the first inclined region, the first inclined region extending from the first end to the free distal end, the first inclined region having a lower surface extending upwards and facing the electrically conductive structure, the lower surface of the first inclined region extending upward from the first end to the free distal end, and wherein the solder material covers the lower surface of the first inclined region and is in direct contact with the lower surface of the first inclined region and with the electrically conductive structure.

2. The pane according to claim 1, wherein the substrate contains glass, polymers, or mixtures of glass and polymers.

3. The pane according to claim 2, wherein the glass is flat glass, float glass, quartz glass, borosilicate glass, or soda lime glass.

4. The pane according to claim 2, wherein the polymers are polyethylene, polypropylene, polycarbonate, or polymethyl methacrylate.

5. The pane according to claim 1, wherein the electrically conductive structure contains silver.

6. The pane according to claim 1, wherein a layer thickness of the solder material is less than $3.0\times10^{-4}$ m.

7. The pane according to claim 1, wherein the solder material contains tin and i) bismuth, indium, zinc, iv) copper, v) silver, or compositions of i)-v).

8. The pane according to claim 7, wherein a proportion of tin in the solder material is 3 wt.-% to 99.5 wt.-% and a proportion of i) bismuth, indium, zinc, iv) copper, v) silver, or compositions of i) - v) is 0.5 wt.-% to 97 wt.-%.

9. The pane according to claim 1, wherein the connection element is coated with nickel, tin, copper, and/or silver.

10. The pane according to claim 9, wherein the connection element is coated with 0.1 µm to 0.3 µm nickel and/or 3 µm to 20 µm silver.

11. The pane according to claim 1, wherein the solder material forms a concave meniscus that extends from the lower surface of the first inclined region to the electrically conductive structure.

12. The pane according to claim 11, wherein the concave meniscus extends from the distal end to the electrically conductive structure.

13. The pane according to claim 1, wherein a height of the first edge region from the electrically conductive structure to the distal end is at most 400 μm.

14. The pane according to claim 1, wherein the flat central region is arranged in direct contact with the electrically conductive structure.

15. A method comprising:
Providing the pane with the at least one electrical connection element according to claim 1; and
using the pane with the at least one electrical connection element for vehicles with electrically conductive structures.

16. A method for production of a pane with at least one connection element, comprising:
applying a solder material on at least one contact surface of a connection element of the at least one connection element with a fixed layer thickness, volume, shape, and arrangement;
applying an electrically conductive structure on a substrate, having a first coefficient of thermal expansion from $8 \times 10-6/°$ C. to $9 \times 10-6/°$ C.;
arranging the connection element with the solder material on the electrically conductive structure,
wherein the connection element has a second coefficient of thermal expansion from $10 \times 10-6/°$ C. to $11.5 \times 10-6/°$ C.,
wherein the connection element contains at least 50 wt.-% to 89.5 wt.-% iron, 16 wt.-% to 20 wt.-% chromium, and one or more selected from the group of carbon, nickel, manganese, molybdenum, and titanium, and
wherein the difference between the first coefficient of thermal expansion of the substrate and the second coefficient of thermal expansion of the connection element is less than $<5 \times 10-6/°$ C.; and
soldering the connection element to subregions of the electrically conductive structure with a layer of a lead-free solder material,
wherein the connection element includes edge regions and is bent upwards on the edge regions to form an intermediate space in which the solder material is present, the intermediate space being formed by the connection element and the electrically conductive structure,
wherein a maximum outflow width of the solder material is negative so that the solder material is pulled back into the intermediate space,
wherein the maximum outflow width is defined as a distance between outer edges of the connection element and a point of the solder material crossover at which the solder material drops below a layer thickness of 50 μm and
wherein a first edge region of the edge regions includes a first end of a first inclined region of the first edge region connected to a flat central region of the first edge region and a free distal end of the first inclined region that is opposite the first end of the first inclined region, the first inclined region extending from the first end to the free distal end, the first inclined region having a lower surface extending upwards and facing the electrically conductive structure, the lower surface of the first inclined region extending upward from the first end to the free distal end, and wherein the solder material covers the lower surface of the first inclined region and is in direct contact with the lower surface of the first inclined region and with the electrically conductive structure.

* * * * *

UNITED STATES PATENT AND TRADEMARK OFFICE
CERTIFICATE OF CORRECTION

PATENT NO. : 11,217,907 B2
APPLICATION NO. : 16/793430
DATED : January 4, 2022
INVENTOR(S) : Harald Cholewa et al.

It is certified that error appears in the above-identified patent and that said Letters Patent is hereby corrected as shown below:

In the Claim

Column 15, Claim 1, Line 54, should read as follows:
1. A pane with at least one electrical connection element, comprising:
a substrate for applying an electrically conductive structure on a region of the substrate, the substrate having a first coefficient of thermal expansion from $8 \times 10^{-6}/°C$ to
$9 \times 10^{-6}/°C$, and
a connection element of the at least one electrical connection element,
wherein the connection element contains at least chromium-containing steel, wherein the connection element has a second coefficient of thermal expansion from $10 \times 10^{-6}/°C$ to $11.5 \times 10^{-6}/°C$,
wherein the connection element contains at least 50 wt.-% to 89.5 wt.-% iron, 16 wt.-% to 20 wt.-% chromium, and one or more selected from the group of carbon, nickel, manganese, molybdenum, and titanium,
wherein the difference between the first coefficient of thermal expansion of the substrate and the second coefficient of thermal expansion of the connection element is less than $5 \times 10^{-6}/°C$; and
a layer of a lead-free solder material,
wherein the layer of the lead-free solder material electrically connects the connection element to subregions of the electrically conductive structure,
wherein the connection element includes edge regions and is bent upwards on the edge regions to form an intermediate space in which the solder material is present, the intermediate space being formed by the connection element and the electrically conductive structure,
wherein a maximum outflow width of the solder material is negative so that the solder material is pulled back into the intermediate space,
wherein the maximum outflow width is defined as a distance between outer edges of the connection element and a point of the solder material crossover at which the solder material drops below a layer thickness of 50 µm, and
wherein a first edge region of the edge regions includes a first end of a first inclined region of the first edge region connected to a flat central region of the first edge region and a free distal end of the first in dined region that is opposite the first end of the first inclined region, the first inclined region extending from said first end to the free distal end, the first inclined region having a lower surface extending Signed and Sealed this
Fifth Day of April, 2022

Drew Hirshfeld
*Performing the Functions and Duties of the
Under Secretary of Commerce for Intellectual Property and
Director of the United States Patent and Trademark Office* upwards and facing the electrically conductive structure, the lower surface of the first inclined region extending upward from the first end to the free distal end, and wherein the solder material covers the lower surface of the first inclined region and is in direct contact with the lower surface of the first inclined region and with the electrically conductive structure.

Column 17, Claim 16, Line 16, should read as follows:
16. A method for production of a pane with at least one connection element, comprising:
applying a solder material on at least one contact surface of a connection element of the at least one connection element with a fixed layer thickness, volume, shape, and arrangement;
applying an electrically conductive structure on a substrate, having a first coefficient of thermal expansion from $8 \times 10\text{-}6/°C$ to $9 \times 10\text{-}6/°C$;
arranging the connection element with the solder material on the electrically conductive structure, wherein the connection element has a second coefficient of thermal expansion from $10 \times 10\text{-}6/°C$ to $11.5 \times 10\text{-}6/°C$,
wherein the connection element contains at least 50 wt.-% to 89.5 wt.-% iron, 16 wt.-% to 20 wt.-% chromium, and
one or more selected from the group of carbon, nickel, manganese, molybdenum, and titanium, and wherein the difference between the first coefficient of thermal expansion of the substrate and the second coefficient
of thermal expansion of the connection element is less than $5 \times 10\text{-}6/°C$; and
soldering the connection element to subregions of the electrically conductive structure with a layer of a lead-free solder material,
wherein the connection element includes edge regions and is bent upwards on the edge regions to form an intermediate space in which the solder material is present, the intermediate space being formed by the connection element and the electrically conductive structure,
wherein a maximum outflow width of the solder material is negative so that the solder material is pulled back into the intermediate space,
wherein the maximum outflow width is defined as a distance between outer edges of the connection element and a point of the solder material crossover at which the solder material drops below a layer thickness of 50 μm, and wherein a first edge region of the edge regions includes a first end of a first inclined region of the first edge region connected to a flat central region of the first edge region and a free distal end of the first inclined region that is opposite the first end of the inclined first region, the first inclined region extending from the first end to said free distal end, the first inclined region having a lower surface extending upwards and facing the electrically conductive structure, the lower surface of the first inclined region extending upward from the first end to the free distal end, and wherein the solder material covers the lower surface of the first inclined region and is in direct contact with the lower surface of the first inclined region and with the electrically conductive structure.